(12) United States Patent
Tarkington et al.

(10) Patent No.: US 9,119,285 B2
(45) Date of Patent: Aug. 25, 2015

(54) CONDUCTIVE GASKETS WITH INTERNAL CAVITIES

(75) Inventors: David P. Tarkington, Sunnyvale, CA (US); Michelle R. Goldberg, Sunnyvale, CA (US); Nicholas A. Rundle, San Jose, CA (US); Peter N. Jeziorek, Mountain View, CA (US); Jonathan Haylock, Los Angeles, CA (US); Jerzy Guterman, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 370 days.

(21) Appl. No.: 13/527,491

(22) Filed: Jun. 19, 2012

(65) Prior Publication Data
US 2013/0335285 A1    Dec. 19, 2013

(51) Int. Cl.
*H01Q 1/24* (2006.01)
*H05K 9/00* (2006.01)
*H01Q 1/52* (2006.01)
*H01Q 1/44* (2006.01)
*H01Q 1/48* (2006.01)

(52) U.S. Cl.
CPC .. *H05K 9/00* (2013.01); *H01Q 1/44* (2013.01); *H01Q 1/48* (2013.01); *H01Q 1/526* (2013.01); *H05K 9/0015* (2013.01)

(58) Field of Classification Search
CPC ..................................................... H01Q 1/526
USPC ......... 343/841, 702; 361/816, 818; 174/35 R, 174/35 GC, 355, 356
See application file for complete search history.

(56) References Cited

U.S. PATENT DOCUMENTS

| 5,486,405 | A | 1/1996 | Laves |
| 5,637,377 | A | 6/1997 | Vermillion |
| 5,902,956 | A | 5/1999 | Spies et al. |
| 6,259,609 | B1 * | 7/2001 | Kurz .............................. 361/818 |

(Continued)

FOREIGN PATENT DOCUMENTS

| JP | 200013090 A * | 1/2000 | ............... H05K 9/00 |
| WO | 9502953 | 1/1995 | |
| WO | 2011140064 | 11/2011 | |

OTHER PUBLICATIONS

JO Nakashima, "Snake," (image) [Retrieved on Apr. 10, 2012]. Retrieved from the Internet:<URL: http://i.ytimg.com/vi/0oj9g9gBAzw/0.jpg>.

(Continued)

*Primary Examiner* — Tho G Phan
(74) *Attorney, Agent, or Firm* — Treyz Law Group; Joseph F. Guihan

(57) ABSTRACT

Electronic devices may be provided with conductive structures such as displays and conductive housing walls. Conductive gaskets may be used to form electrical paths between opposing conductive structures in an electronic device. During device assembly, a conductive gasket may be compressed between opposing conductive structures. The conductive gasket may be formed from a conductive gasket wall structure. The conductive gasket wall structure may surround and at least partly enclose an air-filled cavity. Conductive gasket wall structures may be formed from conductive fabric, dielectric sheets coated with metal, or other conductive wall materials. The interior of a conductive gasket may be hollow and completely devoid of supporting structures or may contain internal structures for biasing the conductive gasket wall outwards. Planar gaskets and gaskets with other cross sections may be provided.

19 Claims, 31 Drawing Sheets

(56) References Cited

U.S. PATENT DOCUMENTS

| | | |
|---|---|---|
| 6,426,881 B1 * | 7/2002 | Kurz .............................. 361/800 |
| 6,618,271 B1 * | 9/2003 | Erickson et al. ............... 361/818 |
| 6,667,092 B1 | 12/2003 | Brollier et al. |
| 6,784,363 B2 | 8/2004 | Jones |
| 6,870,092 B2 | 3/2005 | Lambert et al. |
| 6,943,287 B2 | 9/2005 | Lloyd et al. |
| 7,461,444 B2 | 12/2008 | Deaett et al. |
| 7,463,198 B2 | 12/2008 | Deaett et al. |
| 7,470,866 B2 | 12/2008 | Dietrich et al. |
| 7,732,714 B2 | 6/2010 | Hammaker et al. |
| 2006/0260838 A1 | 11/2006 | Ariel |
| 2009/0140499 A1 | 6/2009 | Kline |
| 2011/0244930 A1 | 10/2011 | Kong et al. |
| 2012/0061135 A1 | 3/2012 | Hill et al. |
| 2013/0333919 A1 * | 12/2013 | Nguyen et al. ............. 174/126.1 |

OTHER PUBLICATIONS

Nguyen et al., U.S. Appl. No. 13/527,482, filed Jun. 19, 2012.

* cited by examiner

CONDUCTIVE GASKETS WITH INTERNAL CAVITIES

BACKGROUND

This relates generally to electronic devices and, more particularly, to conductive gaskets.

Conductive gaskets are used in electronic devices to short conductive structures together. For example, a conductive component such as a portion of a display or antenna may be electrically coupled to a conductive member by compressing a conductive gasket between the component and conductive member. This may short the conductive component to the conductive member, thereby grounding the conductive component and reducing interference in the electronic device.

Conductive gaskets are typically formed from foam that is wrapped in a conductive fabric. During assembly, the foam is compressed between the structures that are being shorted together. The foam attempts to return to its original uncompressed shape, thereby biasing the conductive fabric against the conductive structures.

It can be challenging to use foam gaskets. The biasing forces produced by compressed foam may tend to disassemble parts and may create undesired stresses. The electrical conductivity of foam gaskets may also depend on how much the foam gaskets are compressed. For example, if the foam gaskets are not sufficiently compressed, the foam gaskets may provide poor electrical grounding paths. To ensure adequate mechanical tolerances and to ensure sufficient conductivity of the foam gaskets, it may be necessary to use generously sized foam thicknesses. Overcoming the strong biasing forces that may result from the use of thick foam can be difficult and can force a designer to make undesired compromises when constructing an electronic device.

It would therefore be desirable to be able to provide improved conductive gaskets for use in electronic devices.

SUMMARY

Electronic devices may be provided with conductive structures such as displays and conductive housing walls. Conductive gaskets may be used to form electrical paths between opposing conductive structures in an electronic device. During device assembly, a conductive gasket may be compressed between opposing conductive structures. The compressed conductive gasket may press outwards against the conductive structures, thereby forming an electrical pathway between the conductive structures.

The conductive gasket may be formed from a conductive gasket wall structure. The conductive gasket wall structure may surround and at least partly enclose an air-filled cavity. By avoiding the use of internal support structure material in at least part of the interior of the gasket, outward biasing forces that are produced when the gasket is compressed may be minimized.

Conductive gaskets may be planar, may be tubular, or may have other shapes. For example, a conductive gasket may have an elongated tubular shape characterized by a longitudinal axis. Conductive gasket wall material may be wrapped around the longitudinal axis. The interior of the conductive gasket may be partly filled with internal support structures such as undulating foam, fiber-based material, a corrugated sheet of flexible material, hollow or solid rods or spheres, a sheet of foam or other flexible material that lines an inner surface of a conductive gasket wall structure, or other internal structures. If desired, the interior of a conductive gasket may be completely devoid of supporting structures and may form a hollow conductive gasket.

Conductive gasket wall structures may be formed from conductive fabric, metal coated on dielectric sheets, or other conductive wall structures. Conductive fabric may be formed from metal fibers, dielectric fibers coated with metal, combinations of conductive fibers and fibers that are not conductive, or other suitable fibers.

Conductive gaskets may be attached to opposing conductive structures using adhesives such as pressure-sensitive adhesives. Clamping tools may be used to apply pressure to the adhesives so that the conductive gaskets are attached to the opposing conductive structures. Support structures having protruding members may be used to help ensure that the conductive gaskets are not deformed when compressed by clamping tools.

Further features of the invention, its nature and various advantages will be more apparent from the accompanying drawings and the following detailed description of the preferred embodiments.

DETAILED DESCRIPTION

Electronic devices may be provided with antennas and other wireless communications circuitry. The wireless communications circuitry may be used to support wireless communications in wireless communications bands such as wireless local area network bands, cellular telephone bands, satellite navigation system bands, and other communications bands. Electronic device may also contain electronic components such as displays. When operating an electronic device, it is often desirable to short together conductive structures. For example, it may be desirable to ground a portion of a display or a portion of an antenna to a conductive housing structure. By shorting together the conductive structures, electromagnetic interference (EMI) within an electronic device may be reduced. Conductive structures may also be shorted together to reduce the likelihood of component damage during electrostatic discharge events and to ensure proper grounding for other device functions.

The conductive structures that are being shorted together in an electronic device are often separated by an air gap. A conductive gasket structure may be interposed between opposing conductive structures to form a shorting path. The conductive gasket structure may be configured to span the air gap between the opposing conductive structures when the conductive structures and gasket structures are assembled together into an electronic device.

A conductive gasket structure may be compressed between opposing conductive structures during device assembly. Excessive restoring force from the compressed gasket structure may be avoided by using hollow gasket arrangements and/or gasket configurations that include relatively weak internal biasing structures. Examples of weak internal biasing approaches include the use of hollow gaskets, the use of gaskets that are partially hollow, the use of gaskets that are only partly filled with foam, the use of gaskets filled with plastic wool, the use of corrugated internal biasing structures, and the use of other biasing structures that contain relatively large amounts of air so that the interior cavity regions within the gaskets are at least partly air filled.

Figure 1:
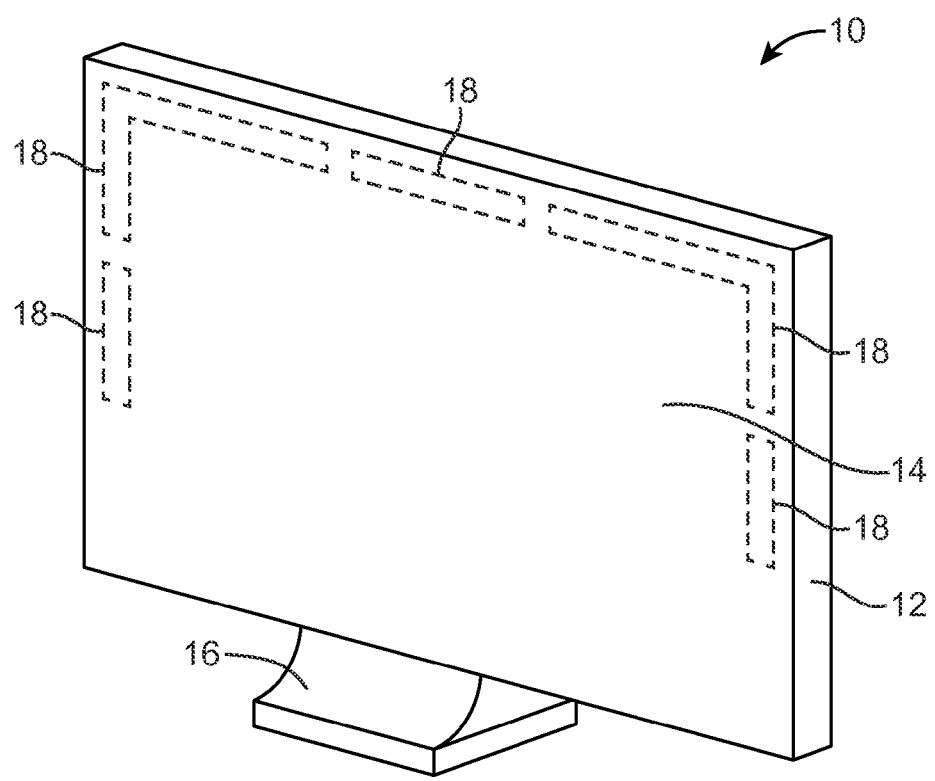
FIG. 1 is a perspective view of an illustrative electronic device with conductive gasket structures in accordance with an embodiment of the present invention.

An illustrative electronic device of the type that may be provided with one or more conductive gaskets is shown in FIG. 1. Electronic device 10 may be a computer such as a computer that is integrated into a display such as a computer monitor. Electronic device 10 may also be a laptop computer, a tablet computer, a somewhat smaller portable device such as a wrist-watch device, pendant device, headphone device, earpiece device, or other wearable or miniature device, a cellular telephone, a media player, or other electronic equipment. Illustrative configurations in which electronic device 10 is a computer formed from a computer monitor are sometimes described herein as an example. In general, electronic device 10 may be any suitable electronic equipment.

Conductive gaskets may be formed in device 10 in any suitable location such as locations 18. Locations 18 may include, for example, edge locations that run parallel to the four edges of device 10 and corner locations at the upper or lower corners of device 10 (as examples). Device 10 may include conductive structures that are electrically shorted together using conductive gaskets. The conductive structures may include conductive housing structures, conductive structures such as metal traces on dielectric carriers, conductive structures that are parts of display modules (e.g., metal chassis structures), metal traces in flexible printed circuits and rigid printed circuits, metal foil supported by dielectric carrier structures, wires, cables, and other conductive materials.

Device 10 may include a display such as display 14. Display 14 may be mounted in a housing such as electronic device housing 12. Housing 12 may be supported using a stand such as stand 16 or other support structure.

Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Display 14 may be a touch screen that incorporates capacitive touch electrodes or other touch sensor components or may be a display that is not touch sensitive.

Figure 2:
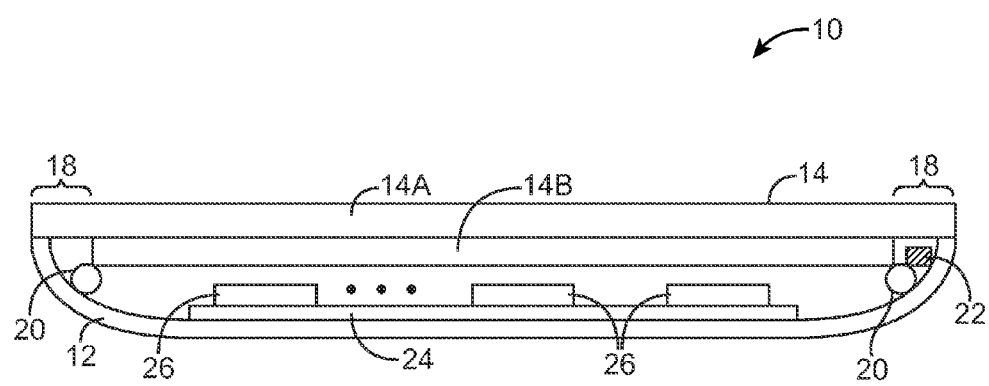
FIG. 2 is a cross-sectional side view of illustrative conductive gaskets within an illustrative electronic device in accordance with an embodiment of the present invention.

A cross-sectional side view of device 10 is shown in FIG. 2. As shown in FIG. 2, display 14 may include a transparent display cover layer such as display cover layer 14A. Display cover layer 14A may be formed from a clear glass layer, a transparent layer of plastic, or other transparent material. Display 14 may include display structures 14B. Display structures 14B may include an array of display pixels for displaying images for a user. Display cover layer 14A may be used to protect display structures 14B and, if desired, touch sensor structures in display 14. Display structures 14B may include display pixels formed from light-emitting diodes (LEDs), organic LEDs (OLEDs), plasma cells, electrophoretic display structures, electrowetting display structures, liquid crystal display (LCD) components, or other suitable display pixel structures.

As shown in the example of FIG. 2, conductive gaskets such as conductive gaskets 20 may be used to electrically connect opposing conductive structures in device 10. In the FIG. 2 configuration, gaskets 20 are being used to electrically connect display structures 14B to housing 12. Display structures 14B may include conductive structures such as a metal chassis member that surrounds and encloses the lower portion of display structures 14B. Housing 12 may include metal walls. Gaskets 20 in regions 18 may be used in shorting the metal chassis member of display 14 or other conductive component structures to conductive housing 12 or may otherwise be used in shorting together conductive structures in device 10. If desired, gaskets 20 may be used to short an antenna ground (e.g., an antenna cavity wall) in antennas such as antenna 22 to opposing conductive structures such as display structures 14B and/or conductive housing 12.

By forming conductive interfaces that fill gaps between opposing conductive structures such as display structures 14B and housing 12 and by otherwise grounding conductive structures within device 10, potential pathways for electromagnetic interference within device 10 may be reduced or eliminated. For example, by forming a conductive seal between display structures 14B and housing 12, potential pathways for electromagnetic interference between components 26 on printed circuit 24 and components such as antenna 22 may be blocked. Components 26 may include display driver circuitry, processors, memory, communications circuitry such as wireless transceiver circuitry, and application-specific integrated circuits. By blocking the air gap between components 14B and housing 12, a reduced number of interfering signals may pass between antenna 22 and components 26, thereby improving wireless performance in device 10. In general, conductive gaskets such as conductive gaskets 20 of FIG. 2 may be used to short together any two or more conductive structures in device 10. The illustrative configuration of FIG. 2 is merely an example.

Figure 3:
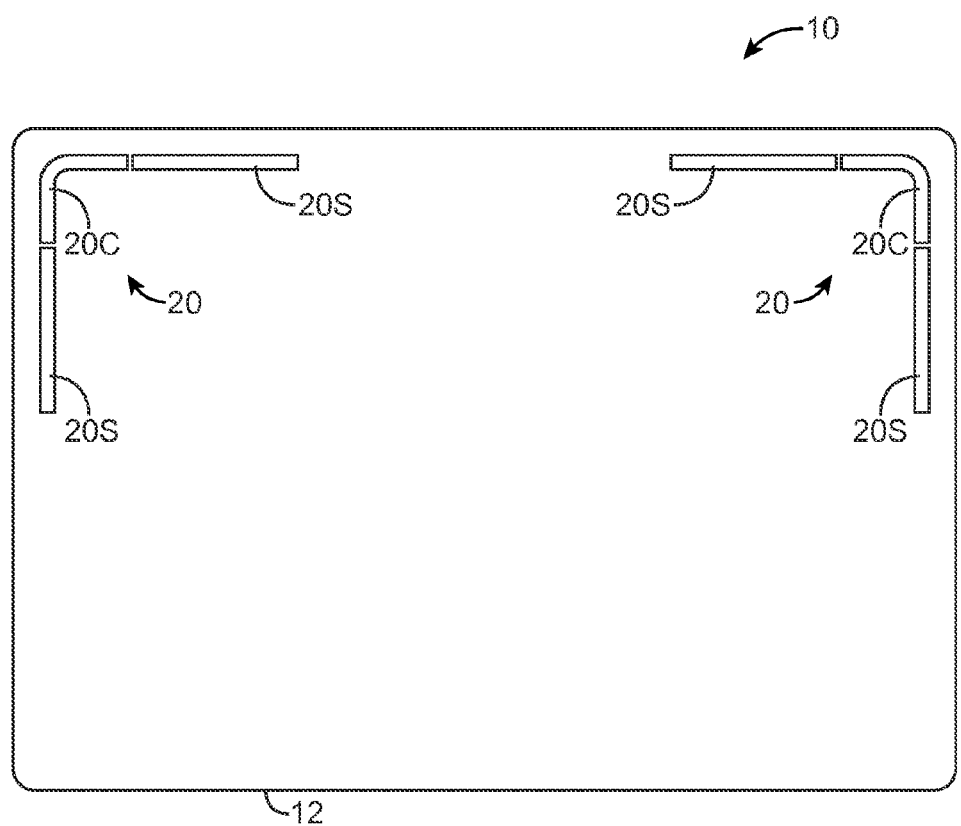
FIG. 3 is a top view of an illustrative electronic device with curved and straight elongated conductive gaskets in accordance with an embodiment of the present invention.

FIG. 3 is a top view showing how conductive gaskets 20 may have elongated shapes that are straight (e.g., straight gaskets 20S) and curved (e.g., curved gaskets 20C). In the illustrative configuration of FIG. 3, gaskets 20 have been placed so that they run parallel to the straight edges and curved corners of housing 12. If desired, gaskets 20 may be placed within other locations in device 10. The configuration of FIG. 3 is merely illustrative.

Figure 4:
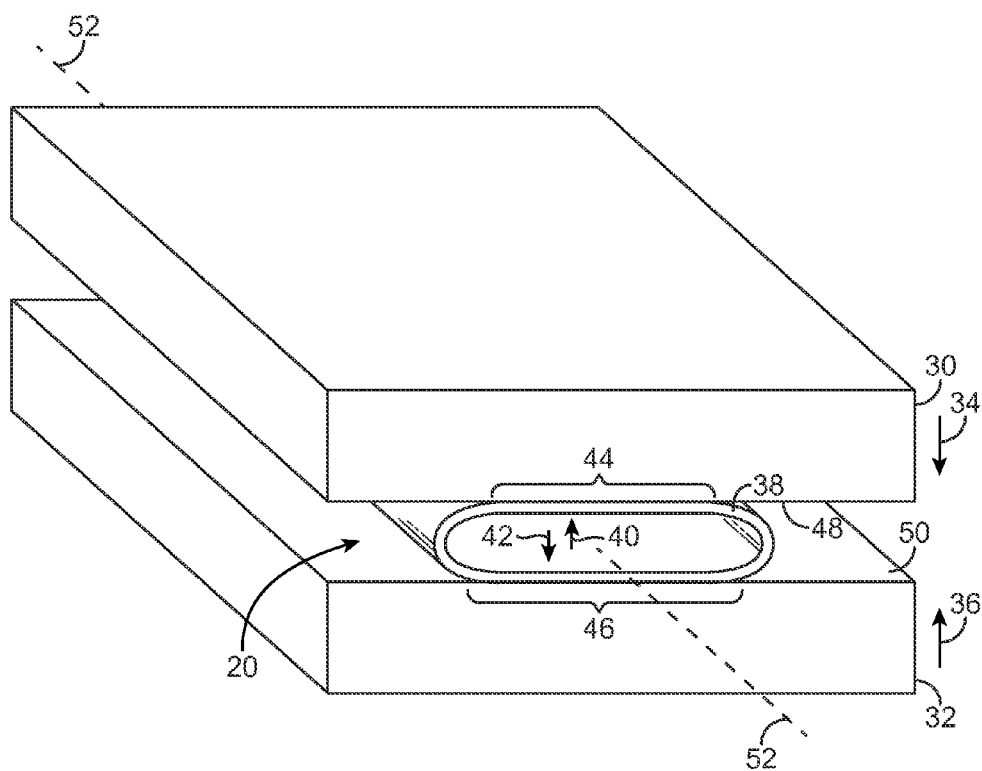
FIG. 4 is a perspective view of an illustrative tube-shaped conductive gasket compressed between two opposing conductive structures in accordance with an embodiment of the present invention.

Gaskets 20 may have a hollow tube shape or other configuration that is compressible, but that does not exert excessive restoring forces upon structures in device 10 following assembly. An illustrative arrangement in which a hollow tube-shaped conductive gasket has been compressed between two opposing conductive structures is shown in FIG. 4. As shown in FIG. 4, conductive device structures such as structures 30 and 32 may be moved towards each other during device assembly operations. As structure 30 is moved downwards in direction 34 towards structure 32 and/or as structure 32 is moved upwards in direction 36 towards structure 30, conductive gasket 20 may be compressed between structures 30 and 32.

When compressed, gasket wall 38 may press outwards against conductive structures 30 and 32, thereby forming an electrical pathway between structures 30 and 32. For example, the upper portion of gasket wall 38 may press upwards in direction 40 against lower surface 48 of structure 30 in region 44 and the lower portion of gasket wall 38 may press downwards in direction 42 against upper surface 50 of structure 32. Relatively large contact patches (i.e., the areas in regions 44 and 46) may be used in forming connections to structures 30 and 32, thereby minimizing contact resistance.

Gaskets such as gasket 20 may have any suitable shape. In the example of FIG. 4, gasket 20 has an elongated hollow tube shape that extends along longitudinal axis 52. If desired, conductive gaskets such as gasket 20 may be formed with other shapes (e.g., circular outlines, rectangular outlines, square outlines) and may have other cross-sectional shapes. Gaskets 20 may have shapes that accommodate internal biasing structures while leaving room for air-filled cavities within the interior of gasket 20, may have shapes that are completely hollow at one location along their length but that are not completely hollow at another location along their length, etc. The elongated tubular shape of conductive gasket 20 of FIG. 4 is merely illustrative.

Figure 5:
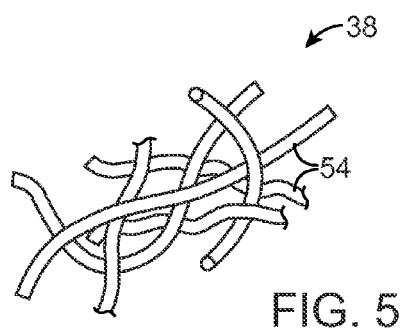
FIG. 5 is a diagram of illustrative fibers in a conductive fabric gasket in accordance with an embodiment of the present invention.

Conductive material for gasket wall 38 may be formed from a sheet of metal, a metal coating on a sheet of dielectric, metal fibers, metal-coated fibers, or other suitable conductive material. As shown in FIG. 5, conductive gasket 20 (e.g., gasket wall 38) may be formed from fibers such as fibers 54 (e.g., gasket wall structure 38 may be formed from a layer of conductive fabric). Fibers 54 may include metal fibers, plastic fibers coated with metal, glass fibers, carbon fibers, organic fibers, inorganic fibers, fibers formed from other materials, and fibers formed from two or more of these materials. Fibers 54 may have circular cross-sectional shapes, oval cross-sectional shapes, rectangular cross-sectional shapes, square cross-sectional shapes, triangular cross-sectional shapes, and other cross-sectional shapes.

Figure 6:
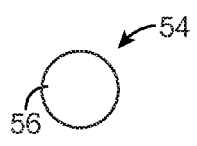
FIG. 6 is a cross-sectional view of a fiber such as a solid fiber in a conductive fabric gasket in accordance with an embodiment of the present invention.
Figure 7:
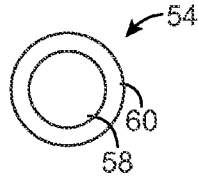
FIG. 7 is a cross-sectional view of a fiber coated with a conductive material such as metal in a conductive fabric gasket in accordance with an embodiment of the present invention.

As shown in FIG. 6, fibers 54 in gasket wall 38 may be formed from a solid material such as material 56. Material 56 may be, for example, a conductive material such as metal. As shown in FIG. 7, fibers 54 may include multiple materials such as inner material (core) 58 and outer material (coating) 60. Core 58 may be, for example, a dielectric such as glass, plastic, or ceramic, or may be a conductive material such as metal (as examples). Outer layer 60 may be formed from a conductive material such as metal (as an example). Layer 60 may be formed on each of fibers 54 before fibers 54 are used in forming conductive fabric or other fiber-based material for gasket wall 38 or may be deposited as a coating on fibers 54 after fibers 54 have been used to form conductive fabric or other fiber-based material for gasket wall 38 (e.g., after fibers 54 have been woven into a fabric layer).

Figure 8:
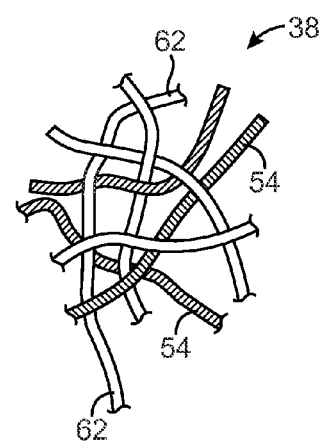
FIG. 8 is a diagram of a conductive fabric having conductive fibers and other fibers in accordance with an embodiment of the present invention.

As shown in FIG. 8, gasket wall 38 (e.g., a fabric sheet for forming wall 38) may include multiple fibers such as fibers 54 and fibers 62. Fibers 54 may include conductive fibers such as solid metal fibers and/or dielectric fibers coated with metal or other conductive fibers. Fibers 62 may be formed from plastic, glass, or other non-conductive material. For example, fibers 62 may be formed from solid dielectric material with a circular cross-sectional shape such as material 56 in FIG. 6. If desired, fabric gasket wall structures such as structures 38 of FIG. 8 may be formed from three or more different types of fibers (e.g., conductive fibers and/or dielectric fibers). The example of FIG. 8 in which structures 38 include two types of fiber is merely illustrative.

Figure 9:
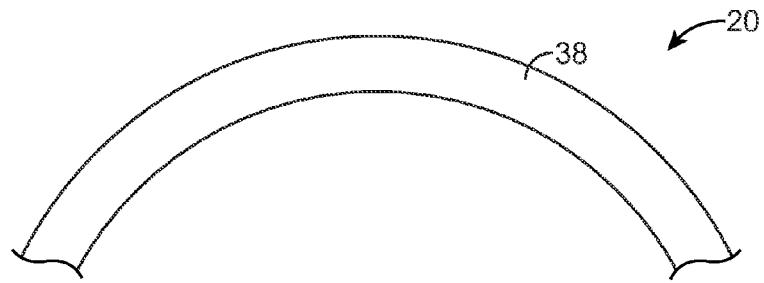
FIG. 9 is a cross-sectional view of a portion of a hollow gasket structure in which a gasket wall is formed from a single layer of material such as a layer of conductive foil or conductive fiber in accordance with an embodiment of the present invention.

FIG. 9 is a cross-sectional view of a portion of conductive gasket structure 20 in which gasket wall 38 has been formed from a single layer of material. Gasket wall 38 may, for example, be formed from a woven conductive fabric with solid conductive fibers and/or fibers with two or more layers of material such as an inner core covered with an outer conductive layer of metal or may be formed from a sheet of flexible metal (e.g., metal foil).

Figure 10:
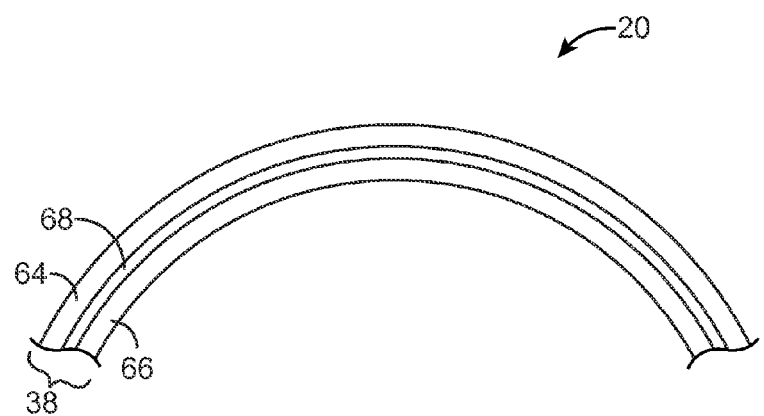
FIG. 10 is a cross-sectional view of a portion of a hollow gasket structure in which a gasket wall is formed from a conductive outer layer of material such as a layer of conductive foil or conductive fiber and an inner support layer such as a layer of plastic or foam that lines the inner surface of the conductive outer layer in accordance with an embodiment of the present invention.

FIG. 10 is a cross-sectional view of a portion of conductive gasket structure 20 in which gasket wall 38 has been formed from a conductive outer layer of material (layer 64) and one or more inner layers of material such as layer 66. Outer layer 64 may be, for example, a conductive fabric such as a fabric formed from solid conductive fibers and/or fibers with two or more layers of material such as an inner core covered with an outer conductive layer of metal. If desired, some or all of outer layer 64 may be formed from a sheet of flexible metal (e.g., metal foil).

Outer layer 64 of conductive gasket structure 20 may be attached to one or more inner layers such as layer 66. For example, outer layer 64 may be attached to inner layer 66 using adhesive layer 68. Adhesive layer 68 may be formed from a pressure sensitive adhesive material, a conductive adhesive material, or other suitable adhesive materials. Inner layer 66 may line the interior surface of layer 64 and may provide layer 64 with additional strength and resiliency. Inner layer 66 may be formed from a flexible layer of metal, a flexible layer of fabric, a flexible layer of plastic, a flexible layer of foam, a flexible layer of one or more other materials, or a flexible layer formed from two or more such layers. If desired, additional layers may be stacked below layer 66 (e.g., layer 66 may be lined with one or more additional layers of fabric, one or more additional layers of plastic, one or more additional layers of foam, etc.).

Figure 11:
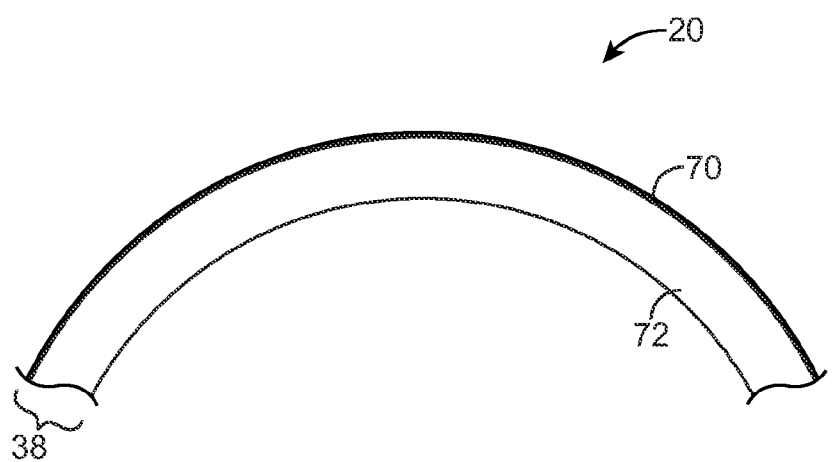
FIG. 11 is a cross-sectional view of a portion of a hollow gasket structure in which a gasket wall is formed from a conductive outer layer of material such as a metal coating on an inner layer such as a dielectric layer formed from plastic in accordance with an embodiment of the present invention.

As shown in the cross-sectional view of FIG. 11, wall 38 of conductive gasket structure 20 may have a conductive coating such as coating 70 that is formed on the outer surface of a flexible support layer such as layer 72. Coating 70 may be, for example, a layer of metal or other conductive material. Layer 72 may be formed from fabric, a layer of plastic, a layer of metal, or a layer formed from one or more other dielectric and/or conductive materials. Coating 70 may be formed on the outer surface of sheet 72 using physical vapor deposition, using chemical vapor deposition, by spraying, by electrochemical deposition (e.g., by electroplating), or by using other suitable deposition techniques.

Figure 12:
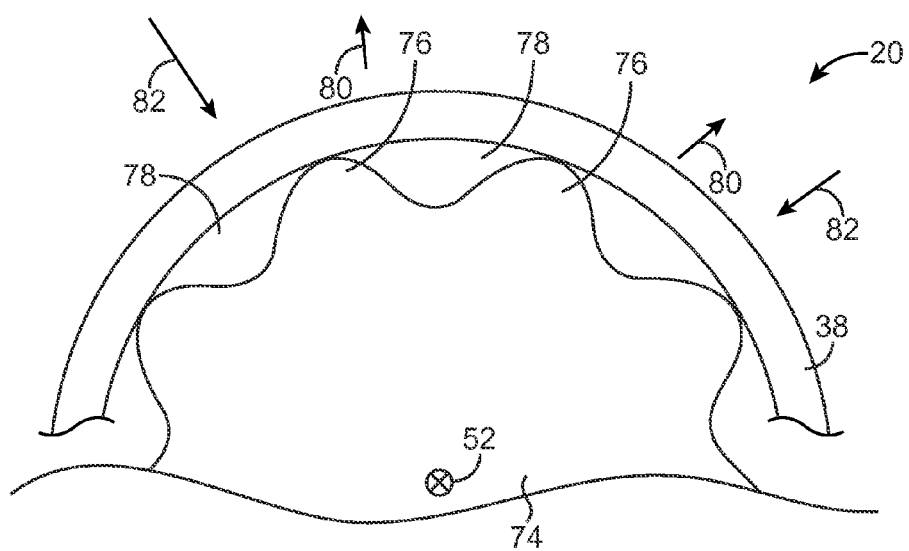
FIG. 12 is a cross-sectional view of a portion of a conductive gasket having an internal support structure formed from a compressible material with an undulating surface such as foam having radially extending arms separated by air-filled cavity regions in accordance with an embodiment of the present invention.

FIG. 12 is a cross-sectional view of a portion of conductive gasket 20 in a configuration in which gasket 20 has an outer wall structure such as wall 38 that is supported by an inner support structure with radially extending arms. As shown in FIG. 12, wall structure 38 may form an outer surface layer for gasket 20. Wall structure 38 may be formed from a layer of conductive fabric (e.g., solid metal fibers woven into a fabric, dielectric fiber cores coated with metal, etc.) or a layer of other conductive material (e.g., metal foil, a coating of metal on a dielectric support layer, etc.). Wall structure 38 may be wrapped around support structure 74. For example, wall structure 38 may be wrapped around longitudinal axis 52 of gasket 20 to form a tube-shaped conductive gasket structure.

Support structure 74 may be formed from foam or other compressible material. To help ensure that the amount of restoring force that is produced in outward directions 80 is less than would be produced when using a solid foam core for gasket 20, support structure 74 may have a shape with an undulating surface that creates air-filled cavities such as cavities 78 within the interior of gasket 20. As shown in FIG. 12, for example, support structure (biasing structure) 74 may have multiple radially extending portions such as extending portions (arms) 76. Each extending portion 76 may extend radially outwards from axis 52 to wall structure 38 in direction 80. When gasket 20 is compressed between opposing conductive structures, support structure 74 will compress accordingly. Portions 76 of compressed structure 74 will then bias wall structure 38 outwards in directions 80, so that conductive wall structure 38 can short opposing conductive structures in device 10 together. The presence of one or more air filled cavities within the interior of gasket 20 such as air-filled cavities 78 may help prevent the biasing force produced by structure 74 from becoming excessive.

Figure 13:
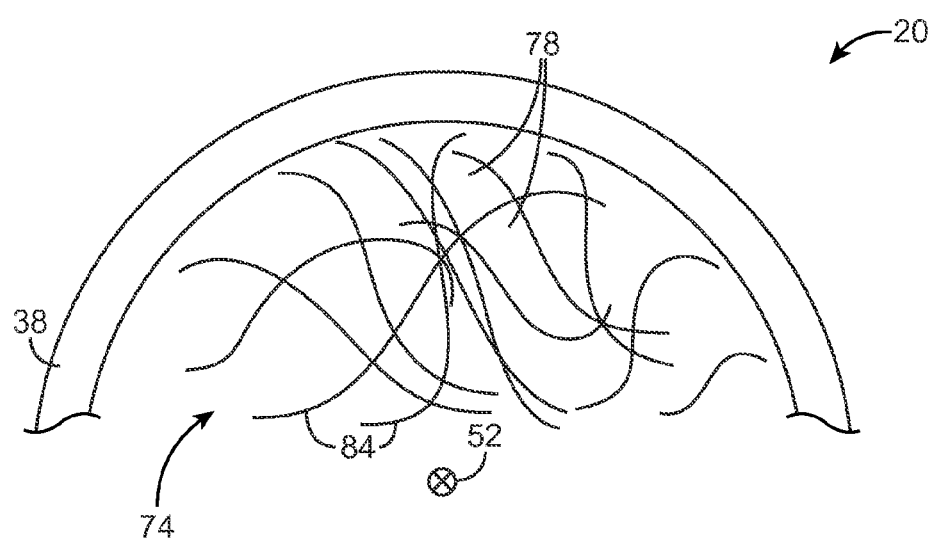
FIG. 13 is a cross-sectional view of a portion of a conductive gasket having an internal biasing structure formed from fibers in accordance with an embodiment of the present invention.

FIG. 13 is a cross-sectional view of a portion of conductive gasket 20 in a configuration in which internal support structure 74 has been formed from fibers 84 (e.g., plastic wool, steel wool, or other material formed from intertwined fibers of plastic, metal, glass, etc.). When wall structure 38 is compressed inwardly by compressing gasket 20 between opposing conductive structures, internal support structure 74 of FIG. 13 will generate an outwardly directed restoring force. Material 74 may be relatively loosely packed to ensure that there are a sufficient number of internal cavities such as air-filled cavity regions 78 between fibers 84. In configurations such as the configuration of FIG. 12 and the configuration of FIG. 13, cavity regions 78 may, for example, occupy 5% or more, 10% or more, or 20% or more, 50% or more, or 75% or more of the interior volume of gasket 20 (as examples).

Figure 14:
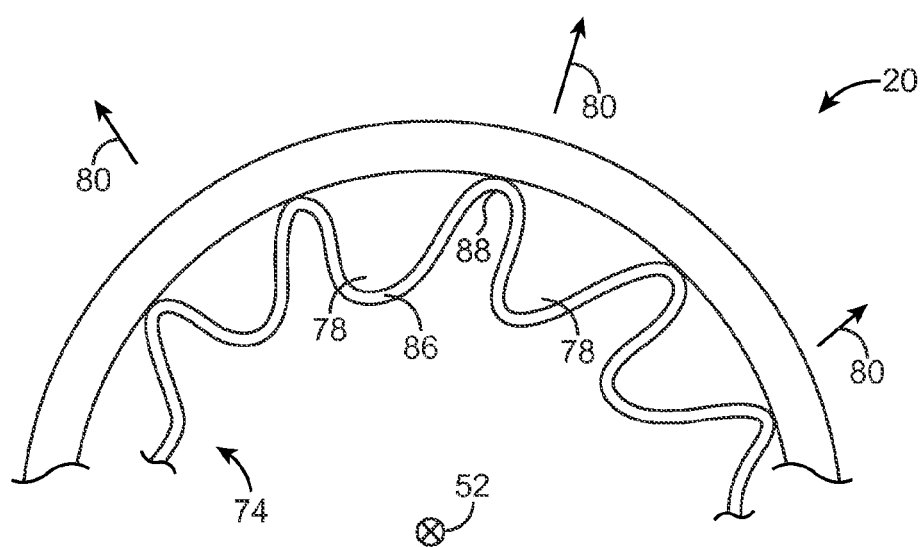
FIG. 14 is a cross-sectional view of a portion of a conductive gasket having an internal biasing structure formed from a corrugated flexible member such as a corrugated sheet of plastic in accordance with an embodiment of the present invention.

If desired, a corrugated structure such as corrugated internal structure 74 of FIG. 14 may be used in supporting gasket wall structure 38. Corrugated structure 74 may be formed from a sheet of material (e.g., a sheet of plastic, fabric, metal, etc.) and may be characterized by inwardly protruding folds such as fold 86 and outwardly protruding folds such as fold 88. Air-filled voids such as cavities 78 may be formed between the folds of corrugated structure 74. When compressed inwardly during installation of conductive gasket 20 between opposing conductive structures in device 10, corrugated structures 74 may flex inwardly and may generate a corresponding outward restoring force that biases gasket wall structure 38 outwardly in directions 80.

Figure 15:
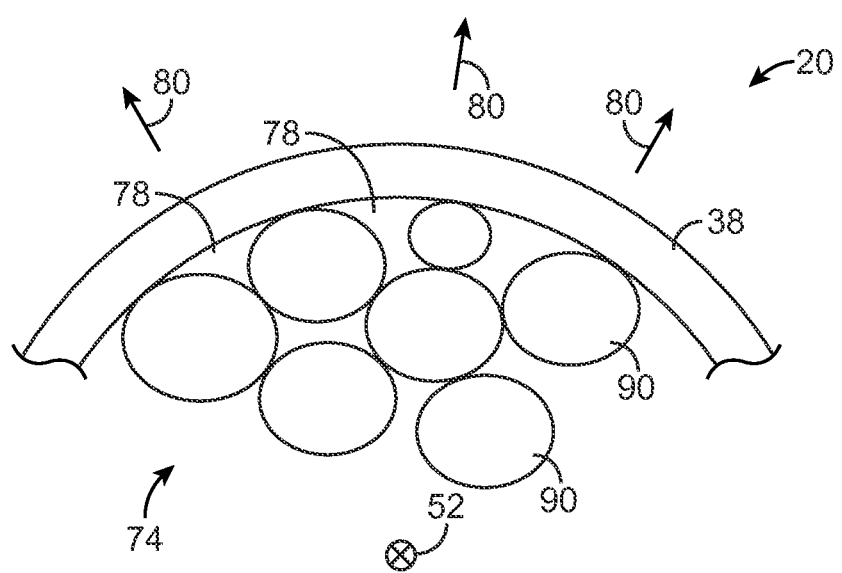
FIG. 15 is a cross-sectional view of a portion of a conductive gasket having an internal biasing structure formed from compressible members such as rods or balls in accordance with an embodiment of the present invention.

In the illustrative configuration for conductive gasket 20 of FIG. 15, gasket wall structure 38 is wrapped around longitudinal axis 52 and an internal structure (structure 74) that is formed from compressible structures 90. Structures 90 may be formed from a compressible material such as foam, hollow structures (e.g., hollow beads or rods), or other structures that can generate a restoring force when compressed. Structures 90 may have the shapes of spheres, rods, cones, or other suitable shapes. The cross-sectional shapes of structures 90 may be circles, squares, rectangles, triangles, ovals, shapes with both straight and curved edges, or other suitable shapes. In situations in which structures 90 are elongated (e.g., when structures 90 have the shape of rods), structures 90 may each be characterized by a longitudinal axis that runs parallel to longitudinal axis 52 of gasket 20. When gasket 20 and gasket wall 38 are compressed inwardly, structures 90 may exhibit an outward restoring force in directions 80, biasing the outer surfaces of gasket 20 against adjacent conductive structures. Cavities such as cavities 78 may be formed between structures 90 to help reduce the outward force that is generated when gasket 20 is compressed.

Figure 16:
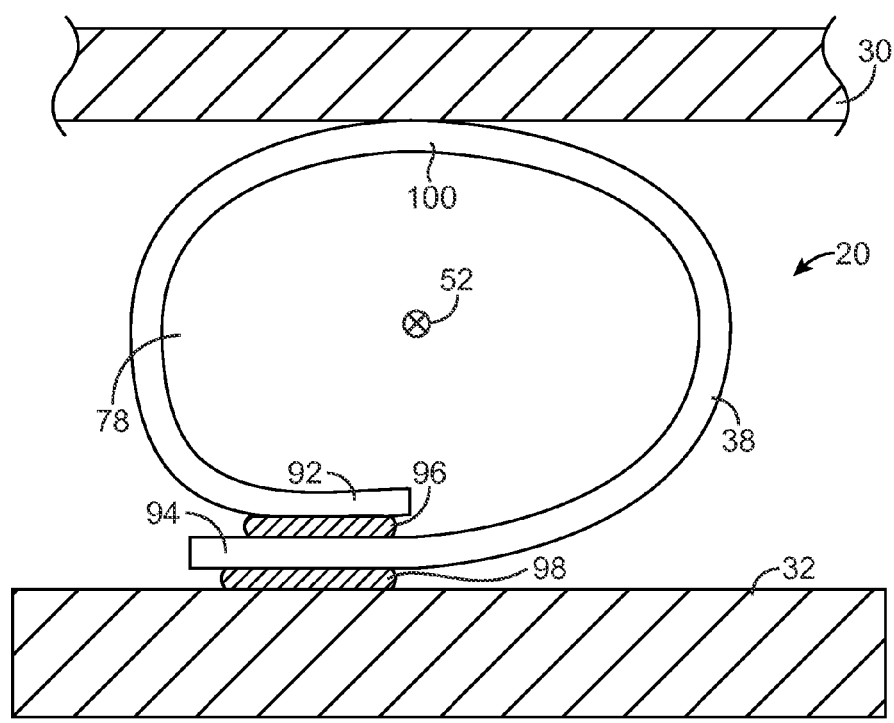
FIG. 16 is a cross-sectional view of a conductive hollow gasket formed from a conductive sheet of material wrapped into an O-shaped tube in accordance with an embodiment of the present invention.

FIG. 16 is a cross-sectional view of conductive gasket 20 in a configuration in which gasket wall 38 is wrapped around longitudinal axis 52 to form an O-shaped tube. As shown in FIG. 16, gasket wall structure 38 may have opposing edges (ends) such as edge 92 and edge 94. Edges 92 and 94 may be wrapped on top of each other so that edge 92 overlaps edge 94. Adhesive such as adhesive layer 96 and adhesive layer 98 may be used in securing gasket wall edges 92 and 94. Adhesive 96 may be used to attach gasket wall portion 92 to gasket wall portion 94. Adhesive 98 may be used to attach gasket wall portion 94 to conductive structure 32. If desired, adhesives such as adhesives 96 and 98 may be formed from conductive adhesive to promote formation of a satisfactory electrical contact between gasket 20 and conductive structure 32. Conductive structure 30 may form an electrical connection with upper portion 100 of gasket 20, thereby allowing conductive gasket 20 to form an electrical path between opposing conductive structures 30 and 32.

Conductive gaskets such as conductive gasket 20 of FIG. 16 that are configured to form an O-shaped tubular gasket structure may be hollow, as illustrated by air-filled cavity 78 of FIG. 16. If desired, a support structure may be formed within the interior of gasket 20. For example, the interior of O-shaped tubular conductive gasket 20 of FIG. 16 may be filled with biasing and support structures such as an internal structure of the type shown in FIG. 12 that has protruding portions 76, an internal fiber-based structure of the type shown in FIG. 13, an internal structure of the type shown in FIG. 14 that is formed from a corrugated sheet of material, an internal structure of the type shown in FIG. 15 having compressible support members such as tubular or spherical structures 90, an internal structure formed from an inner wrapped liner layer such as a foam layer, plastic layer, or inner fiber layer that is formed on the inner surface of an outer conductive layer (see, e.g., FIG. 10), an internal structure that is formed from other structures that provide support and outward biasing for gasket wall 38, and internal structures that use two or more of these structures.

Internal support structures for O-shaped gasket 20 of FIG. 16 may be varied in type and size along the length of longitudinal axis 52. For example, one type of support structure may be used in one longitudinal position and another type of support structure (or no support structure) may be positioned at an adjacent longitudinal position. Support structures of different types (including solid foam support structures and/or structures of the types shown in FIGS. 12, 13, 14, 15, 10, other internal support structures, and cavities such as cavity 78 of FIG. 16) may be alternated with each other along the length of longitudinal axis 52, to ensure that gasket 20 provides a desired amount of outward restoring force when compressed between opposing conductive structures 30 and 32.

Figure 17:
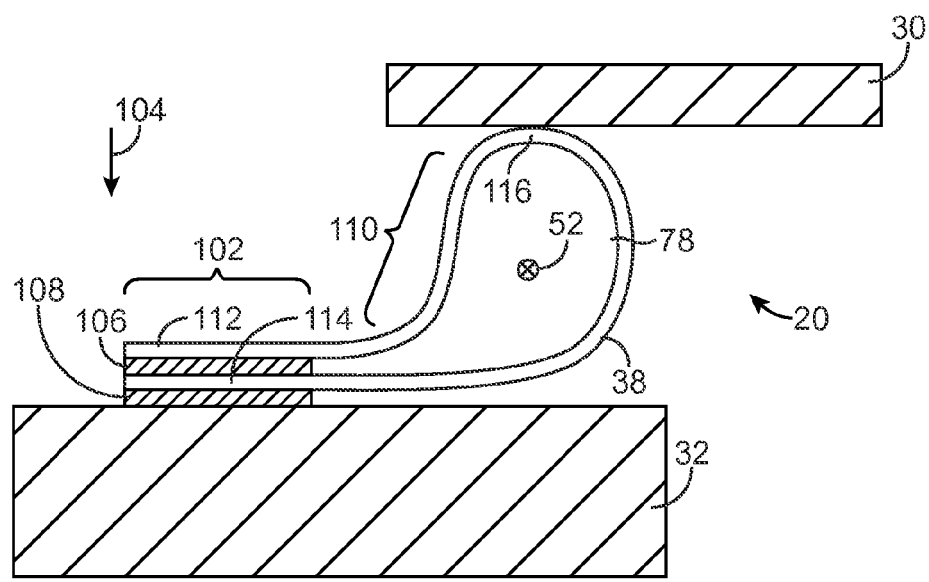
FIG. 17 is a cross-sectional view of a conductive hollow gasket formed from a conductive sheet of material wrapped into a P-shaped tube in accordance with an embodiment of the present invention.

FIG. 17 is a cross-sectional view of conductive gasket 20 in a configuration in which gasket wall 38 is wrapped around longitudinal axis 52 to form a P-shaped tube having main cavity portion 110 and compressed tail portion 102. In main cavity portion 110, gasket wall 38 may surround cavity 78 (i.e., the interior of gasket 20 may be completely hollow). In tail portion 102, opposing edge portions 112 and 114 of cavity wall structure 38 may be pressed downwards against the upper surface of conductive structure 32 in direction 104 (e.g., using an assembly tool). Edges 112 and 114 may be wrapped on top of each other so that edge 112 overlaps edge 114 with the inner surface of edge 114 facing the inner surface of edge 112 (as opposed to the configuration of FIG. 16 in which the outer surface of edge 92 faces the inner surface of edge 94).

Adhesive such as adhesive layer 106 and adhesive layer 108 may be used in securing gasket wall edges 112 and 114. Adhesive 106 may be used to attach gasket wall portion 112 to gasket wall portion 114. Adhesive 108 may be used to attach gasket wall portion 114 to conductive structure 32. Adhesives such as adhesives 106 and 108 may be formed from conductive adhesive to promote formation of a satisfactory electrical contact between gasket 20 and conductive structure 32. Conductive structure 30 may form an electrical connection with upper portion 116 of gasket 20, thereby allowing conductive gasket 20 to form an electrical path between opposing conductive structures 30 and 32 through the conductive materials of gasket wall structure 38.

Conductive gaskets such as conductive gasket 20 of FIG. 17 that are configured to form a P-shaped tubular gasket structure may be hollow, as illustrated by air-filled cavity 78 of FIG. 17. Support structures may be formed within the interior of gasket 20 of FIG. 17, if desired. For example, the interior of P-shaped tubular conductive gasket 20 of FIG. 17 may be filled with biasing and support structures such as an internal structure of the type shown in FIG. 12 that has protruding portions 76, an internal fiber-based structure of the type shown in FIG. 13, an internal structure of the type shown in FIG. 14 that is formed from a corrugated sheet of material, an internal structure of the type shown in FIG. 15 having compressible members such as tubular or spherical structures 90, an internal structure formed from an inner wrapped layer of material such as a foam layer, plastic layer, or inner fiber layer that is formed as a liner on the inner surface of an outer conductive layer (see, e.g., FIG. 10), an internal structure that is formed from other structures that provide support and outward biasing for gasket wall 38, or internal structures that use two or more of these structures. As with internal support structures for O-shaped gasket 20 of FIG. 16, internal support structures for P-shaped gasket 20 of FIG. 17 may be varied in type and size along the length of longitudinal axis 52. For example, one type of support structure may be used in one longitudinal position of P-shaped gasket 20 of FIG. 17 and another type of support structure (or no support structure) may be positioned at an adjacent longitudinal position along axis 52 of P-shaped gasket 20. Support structures of different types (including solid foam support structures and/or structures of the types shown in FIGS. 12, 13, 14, 15, 10, other internal support structures, and cavities such as cavity 78 of FIG. 17) may be alternated with each other along the length of longitudinal axis 52 of gasket 20 of FIG. 17, to ensure that gasket 20 provides a desired amount of outward restoring force when compressed between opposing conductive structures 30 and 32.

Figure 18:
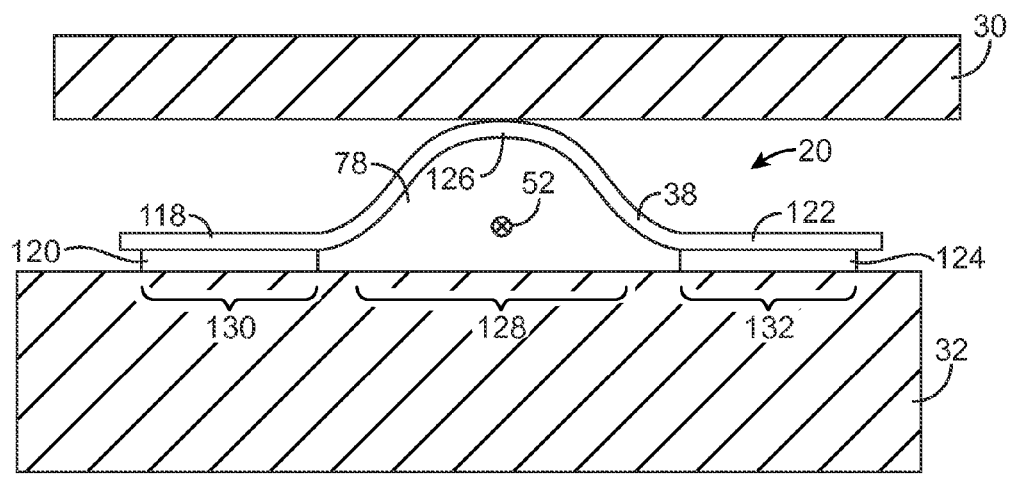
FIG. 18 is a cross-sectional view of a conductive hollow gasket formed from a conductive sheet of material in a C-shaped tube in accordance with an embodiment of the present invention.

FIG. 18 is a cross-sectional view of conductive gasket 20 in a configuration in which gasket wall 38 is wrapped around longitudinal axis 52 sufficiently to form a C-shaped tube having main cavity portion 128 and compressed tail portions such as left tail portion 130 and right tail portion 132. In main cavity portion 128, gasket wall 38 may wrap around the upper portion of cavity 78. The lower portion of cavity 78 may be bounded by a portion of conductive structure 32. In tail portion 130, edge portion 118 of gasket wall structure 38 may be pressed downwards against the upper surface of conductive structure 32. In tail portion 132, edge portion 122 of gasket wall structure 38 may be pressed downwards against the upper surface of conductive structure 32.

Adhesive such as adhesive layer 120 and adhesive layer 124 may be used in securing gasket wall edges 118 and 122 to conductive structure 36. Adhesive 120 may be used to attach gasket wall portion 118 to a left-hand portion of conductive structure 32. Adhesive 124 may be used to attach gasket wall portion 122 to a right-hand portion of conductive structure 32. Adhesives such as adhesives 120 and 124 may be formed from conductive adhesive to promote formation of a satisfactory electrical contact between gasket 20 and conductive structure 32. Conductive structure 30 may form an electrical connection with upper portion 126 of gasket 20, thereby allowing conductive gasket 20 to form an electrical path between opposing conductive structures 30 and 32 through the conductive materials of gasket wall structure 38.

As with gaskets of other shapes, conductive gaskets such as conductive gasket 20 of FIG. 18 that are configured to form a C-shaped tubular gasket structure may be hollow, as illustrated by air-filled cavity 78 of FIG. 18. If desired, support structures may be formed within the interior of gasket 20 of FIG. 18. For example, the interior of C-shaped tubular conductive gasket 20 of FIG. 18 may be filled with biasing and support structures such as an internal structure of the type shown in FIG. 12 that has protruding portions 76, an internal fiber-based structure of the type shown in FIG. 13, an internal structure of the type shown in FIG. 14 that is formed from a corrugated sheet of material, an internal structure of the type shown in FIG. 15 having tubular or spherical structures or other compressible biasing members, an internal structure formed from an inner wrapped layer of material such as a foam layer, plastic layer, or inner fiber layer that is formed as a liner on the inner surface of an outer conductive layer (see, e.g., FIG. 10), an internal structure that is formed from other structures that provide support and outward biasing for gasket wall 38, and internal structures that use two or more of these structures. As with the internal support structures for O-shaped gasket 20 of FIG. 16 and P-shaped gasket 20 of FIG. 17, internal support structures for C-shaped gasket 20 of FIG. 18 may be varied in type and size along the length of longitudinal axis 52. For example, one type of support structure may be used in one longitudinal position of C-shaped gasket 20 of FIG. 18 and another type of support structure (or no support structure) may be positioned at an adjacent longitudinal position along axis 52 of C-shaped gasket 20 of FIG. 18. Support structures of different types (including solid foam support structures and/or structures of the types shown in FIGS. 12, 13, 14, 15, 10, other internal support structures, and cavities such as cavity 78 of FIGS. 17 and 18) may be alternated with each other along the length of longitudinal axis 52 of gasket 20 of FIG. 18, to ensure that gasket 20 provides a desired amount of outward restoring force when compressed between opposing conductive structures 30 and 32.

Figure 19:
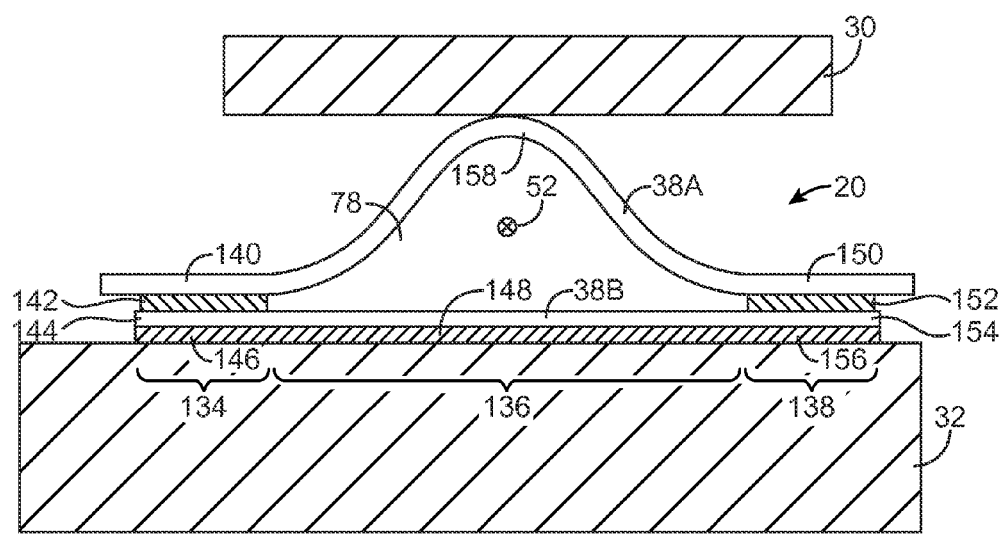
FIG. 19 is a cross-sectional view of a conductive hollow gasket formed from first and second attached sheets of conductive material in accordance with an embodiment of the present invention.

FIG. 19 is a cross-sectional view of conductive gasket 20 in a configuration in which gasket wall 38 has two portions such as portion 38A and portion 38B. Planar portion 38B forms a base for conductive gasket 20. Portion 38A is wrapped around the upper half of longitudinal axis 52 to form a C-shaped upper portion for gasket 20. The C-shaped upper portion for gasket 20 that is formed from gasket sidewall portion 38A and the planar lower wall portion for gasket 20 that is formed from gasket wall structure 38B form a tubular gasket will walls that extend around longitudinal axis 52.

Two-part conductive gasket 20 of FIG. 19 may have a main cavity portion such as main cavity portion 136 and tail portions such as left tail portion 134 and right tail portion 138. Lower gasket wall structure 38B may be attached to conductive structure 32 using adhesive 148. In main cavity portion 136, gasket wall 38A and gasket wall 38B may surround cavity 78. In tail portion 134, edge portion 140 of gasket wall structure 38A may be attached to edge portion 144 of gasket wall structure 38B by adhesive 142 and edge portion 144 of gasket wall structure 38B may be attached to conductive structure 32 by portion 146 of adhesive layer 148. In tail portion 138, edge portion 150 of gasket wall structure 38A may be attached to edge portion 154 of gasket wall structure 38B by adhesive 152 and edge portion 154 of gasket wall structure 38B may be attached to conductive structure 32 by portion 156 of adhesive layer 148. Adhesive such as adhesive layer 142, adhesive layer 152, and adhesive layer 148 may be formed from conductive adhesive to promote formation of a satisfactory electrical contact between gasket 20 and conductive structure 32. Conductive structure 30 may form an electrical connection with upper portion 158 of gasket 20, thereby allowing conductive gasket 20 to form an electrical path between opposing conductive structures 30 and 32 through the conductive materials of gasket wall structure 38.

As with gaskets of other shapes, conductive gaskets such as two-part conductive gasket 20 of FIG. 19 that are configured to form a tubular gasket structure with an upper C-shaped portion and a lower planar portion may be hollow, as illustrated by air-filled cavity 78 of FIG. 19. If desired, support structures may be formed within the interior of gasket 20 of FIG. 19. For example, the interior of tubular conductive gasket 20 of FIG. 19 may be filled with biasing and support structures such as an internal structure of the type shown in FIG. 12 that has protruding portions 76, an internal fiber-based structure of the type shown in FIG. 13, an internal structure of the type shown in FIG. 14 that is formed from a corrugated sheet of material, an internal structure of the type shown in FIG. 15 having tubular or spherical structures or other compressible structures such as structures 90, an internal structure formed from an inner wrapped layer of material such as a foam layer, plastic layer, or inner fiber layer that is formed on the inner surface of an outer conductive layer as a liner (see, e.g., FIG. 10), an internal structure that is formed from other structures that provide support and outward biasing for gasket wall 38, and internal structures that use two or more of these structures. As with the internal support structures for O-shaped gasket 20 of FIG. 16, P-shaped gasket 20 of FIG. 17, and C-shaped gasket 20 of FIG. 18, internal support structures for two-part gasket 20 of FIG. 19 may be varied in type and size along the length of longitudinal axis 52. For example, one type of support structure may be used in one longitudinal position of gasket 20 of FIG. 19 and another type of support structure (or no support structure) may be positioned at an adjacent longitudinal position along axis 52 of gasket 20 of FIG. 19. Support structures of different types (including solid foam support structures and/or structures of the types shown in FIGS. 12, 13, 14, 15, 10, other internal support structures, and cavities such as cavity 78 of FIGS. 17, 18, and 19) may be alternated with each other along the length of longitudinal axis 52 of gasket 20 of FIG. 19, to ensure that gasket 20 provides a desired amount of outward restoring force when compressed between opposing conductive structures 30 and 32.

Figure 20:
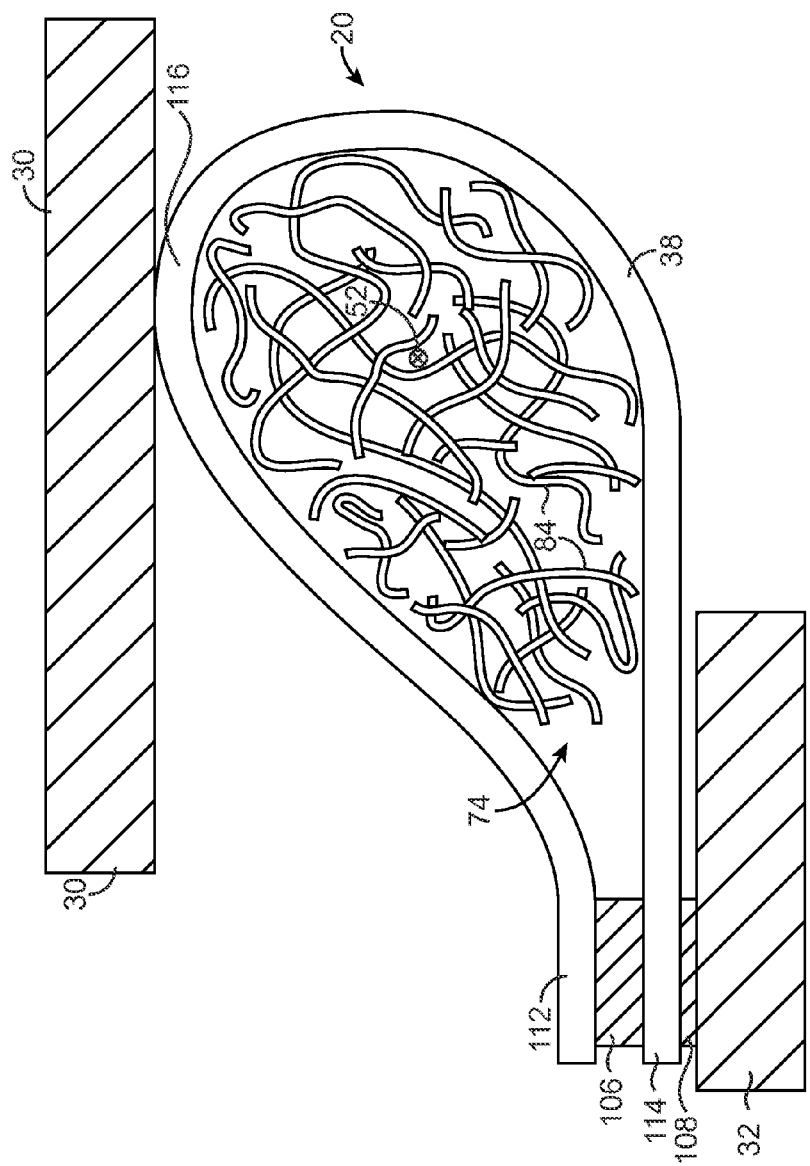
FIG. 20 is a cross-sectional view of a conductive hollow gasket formed from a conductive sheet of material wrapped into a P-shaped tube and filled with biasing structures such as fibers in accordance with an embodiment of the present invention.

FIG. 20 is a cross-sectional view of an illustrative P-shaped gasket filled with an internal biasing structure such as fiber-based structure 74 of FIG. 13. As shown in FIG. 20, internal support structure 74 in P-shaped conductive gasket 20 may include fibers 84 such as plastic fibers, metal fibers, glass, fibers, other fibers, or combinations of these fibers. C-shaped gaskets, O-shaped gaskets, and gaskets formed from two or more gasket wall structures may be provided with internal support structures such as internal support structure 74 of FIG. 20, if desired.

Figure 21:
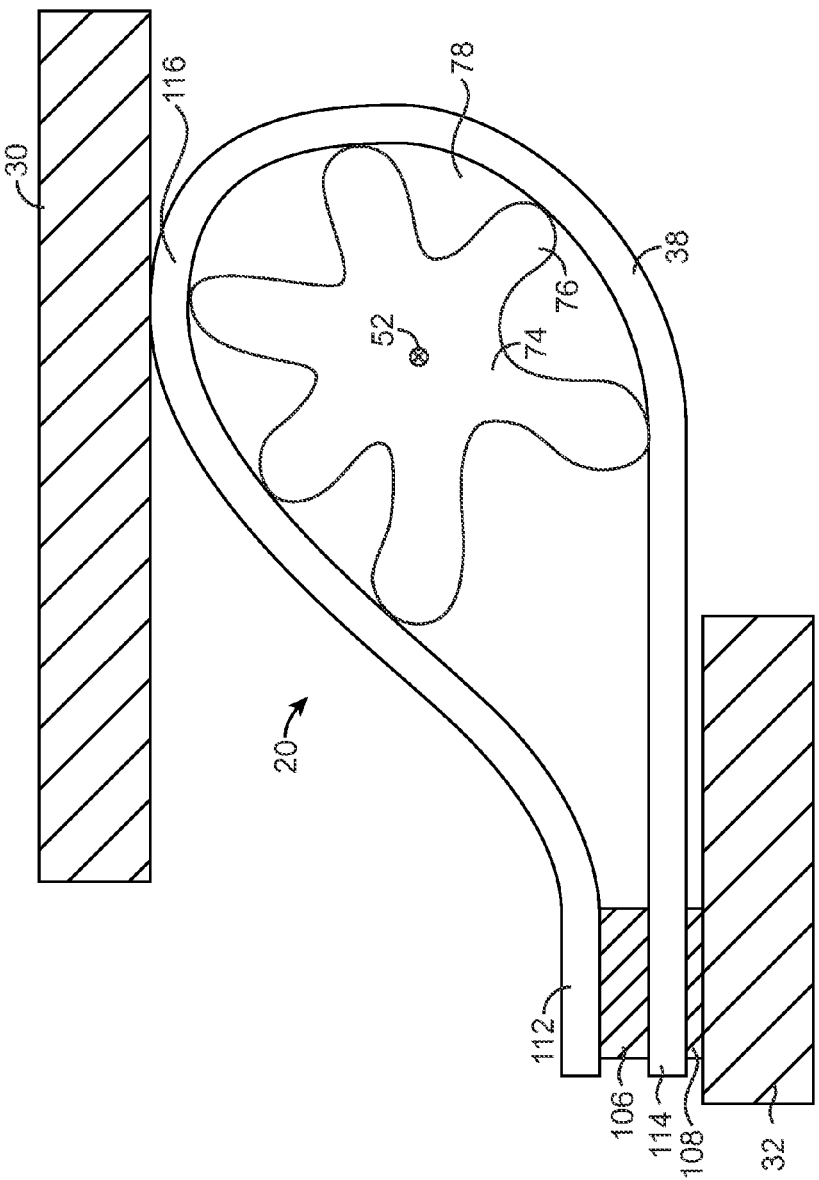
FIG. 21 is a cross-sectional view of a conductive hollow gasket formed from a conductive sheet of material wrapped into a P-shaped tube and filled with biasing structures such as a compressible foam or plastic structure with radially extending arms that form an undulating surface in accordance with an embodiment of the present invention.

FIG. 21 is a cross-sectional view of an illustrative P-shaped gasket filled with an internal biasing structure such as structure 74 of FIG. 12. As shown in FIG. 21, internal support structure 74 in P-shaped conductive gasket 20 may include cavity portions such as cavity portions 78 that are interposed between extending arm portions such as protruding portions 76 of support structure 74. C-shaped gaskets, O-shaped gaskets, and gaskets formed from two or more gasket wall structures may be provided with internal support structures such as internal support structure 74 of FIG. 21, if desired.

Figure 22:
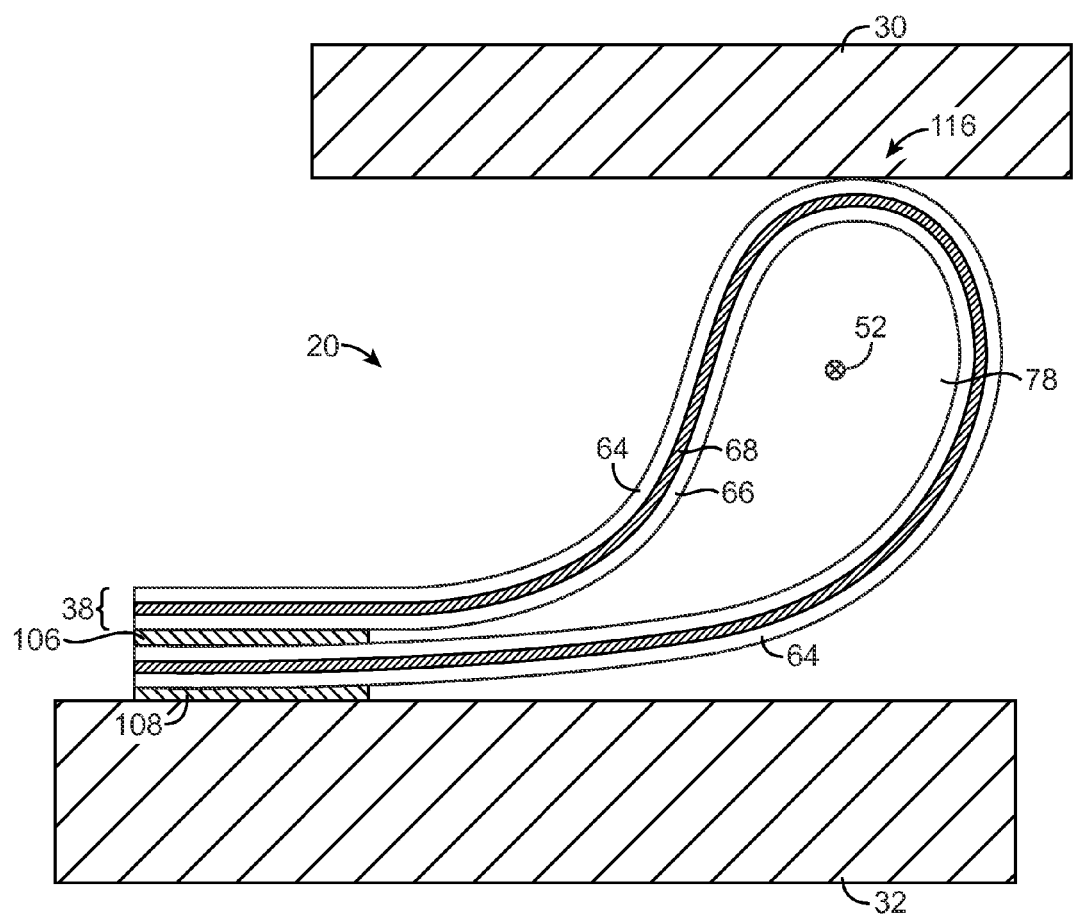
FIG. 22 is a cross-sectional view of a conductive hollow gasket formed from a conductive sheet of material wrapped into a P-shaped tube and lines with biasing structures such as a layer of foam or other resilient substrate material in accordance with an embodiment of the present invention.

FIG. 22 is a cross-sectional view of an illustrative P-shaped gasket having a gasket wall structure with multiple layers such as layers 64 and 66. Adhesive layer 68 may be used to attach layers 64 and 66 to each other, if desired. Outer layer 64 may be a conductive layer (e.g., a conductive fabric layer, a metal foil layer, etc.). Inner layer 66 (e.g., a foam liner or other liner material) may serve as a support and biasing structure, as described in connection such as layer 66 of FIG. 10. As shown in FIG. 22, internal support structure 66 in P-shaped conductive gasket 20 may surround cavity 78. C-shaped gaskets, O-shaped gaskets, and gaskets formed from two or more gasket wall structures may be provided with internal support structures such as internal support structure 66 of FIG. 22, if desired.

Figure 23:
FIG. 23 is a perspective view of a rod of material that may serve as a support structure for forming a hollow conductive tubular gasket in accordance with an embodiment of the present invention.

FIG. 23 is a perspective view of a rod of material that may serve as a support structure for forming a hollow conductive gasket. Rod 160 may be formed from foam, metal, plastic, glass, other materials, or combinations of these materials.

Figure 24:
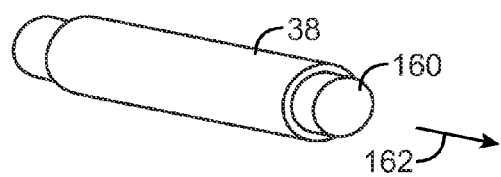
FIG. 24 is a perspective view of the rod of material of FIG. 23 after being wrapped with a layer of conductive material to form a hollow conductive gasket in accordance with an embodiment of the present invention.
Figure 25:
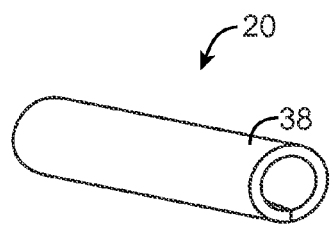
FIG. 25 is a perspective view of the hollow conductive gasket of FIG. 24 following removal of the rod of supporting material in accordance with an embodiment of the present invention.
Figure 26:
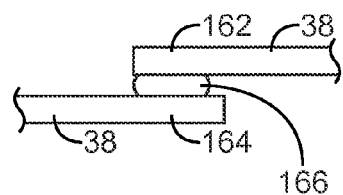
FIG. 26 is a cross-sectional view of a portion of an illustrative seam in a hollow conductive gasket in accordance with an embodiment of the present invention.

FIG. 24 is a perspective view of rod 160 of FIG. 23 after being wrapped with gasket wall layer 38 to form a hollow conductive gasket structure. Following removal of rod 160 in direction 162, gasket wall layer 38 may form conductive gasket 20 of FIG. 25. FIG. 26 shows how opposing edges 162 and 164 of gasket wall structure 38 of gasket 20 of FIG. 25 may be attached to each other using adhesive 166. Adhesive 166 may be formed from a conductive adhesive material or other suitable adhesive. Edges 162 and 164 may be attached so that the inner surface of edge 164 faces the outer surface of edge 162 or edges 162 and 164 may be attached with their inner (or outer) edges facing one another. Extrusion tools and other equipment may also be used in forming gasket structures 20, if desired.

Figure 27:
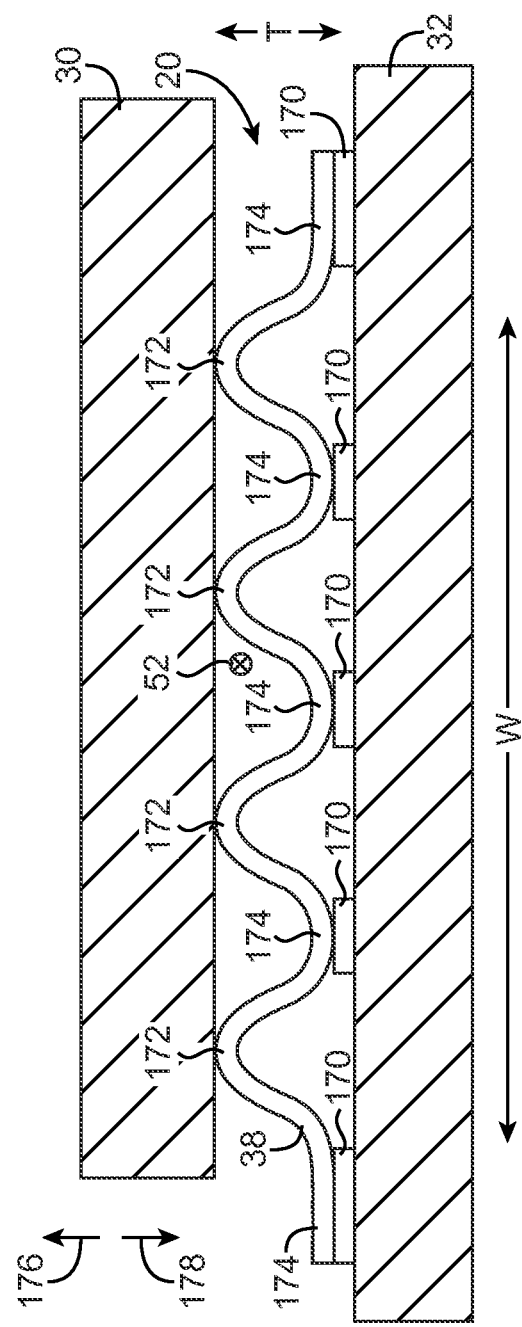
FIG. 27 is a cross-sectional view of a corrugated conductive gasket with a planar shape in accordance with an embodiment of the present invention.

FIG. 27 is a cross-sectional side view of a planar conductive gasket formed using a corrugated gasket wall structure. As shown in FIG. 27, gasket 20 may be formed from an undulating gasket structure such as gasket layer (wall) 38 that has portions 172 that protrude upwards in direction 176 and interleaved portions 174 that protrude downwards in direction 178. Adhesive 170 such as conductive adhesive may be used in attaching gasket layer 38 to conductive structures 32. When compressed between opposing conductive structures 30 and 32, upper portions 172 of gasket 20 may make electrical contact with conductive structure 30, thereby forming an electrical path between structures 30 and 32. Conductive corrugated gasket 20 may have an elongated shape with a length L extending parallel to axis 52 (if desired) and may have a width W that is smaller than L (or that is larger than L). Thickness T may be smaller than width W and length L (as an example). In this type of configuration, conductive gasket 20 of FIG. 27 may have a planar shape suitable for forming conductive paths between conductive structures 30 and 32 that have opposing planar surfaces.

Figure 28:
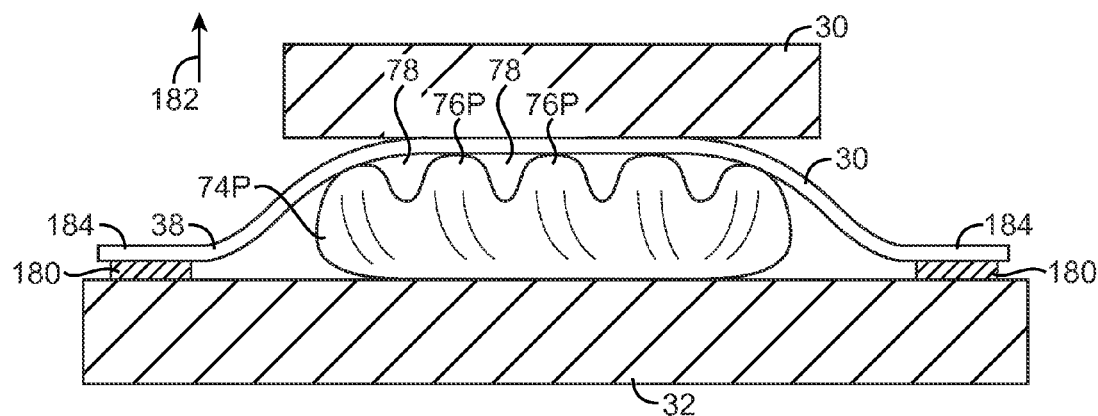
FIG. 28 is a cross-sectional view of a planar conductive gasket structure formed from a sheet of material with a corrugated biasing structure in accordance with an embodiment of the present invention.

FIG. 28 is a cross-sectional side view of an illustrative planar conductive gasket formed by providing conductive gasket structure 38 with a structure such as structure 74P. Structure 74P may be a compressible structure that serves to bias gasket structure 38 (e.g., a layer of gasket wall material) upwards in direction 182 when gasket 20 is compressed between opposing conductive structures 30 and 32. Sheet 38 may be attached to conductive structure 32. For example, adhesive 180 such as conductive adhesive may be used to attach edge portions 184 of gasket layer 38 to conductive structure 32. Structures 74P may be formed from foam, foam with protruding portions such as portions 76P that are separated by cavity regions 78, undulating plastic (corrugated plastic) or undulating structures formed from other materials, fiber-based materials, or other support structures (e.g., a liner structure attached to the underside of layer 38).

Figure 29:
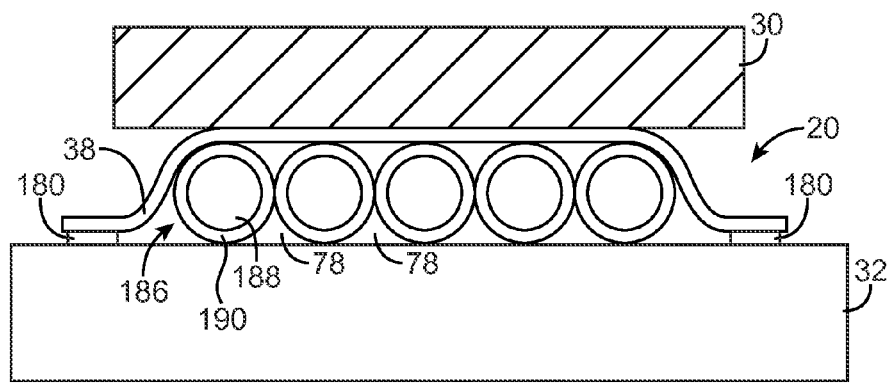
FIG. 29 is a cross-sectional view of a planar conductive gasket structure formed from a sheet of material with internal biasing structures such as spheres or rods in accordance with an embodiment of the present invention.

In the illustrative configuration for planar conductive gasket 20 that is shown in FIG. 29, support and outward (upwards) biasing have been provided by support structures 186. Support structures 186 may be solid support structures (e.g., support structures in the shapes of spheres or rods) or may be hollow. For example, support structures 186 may be hollow and may have outer layers such as layer 190 that surround inner cavities such as cavity 188 (i.e., structures 186 may be hollow spheres or hollow rods). Support structures 186 may also be provided that have other shapes. The use of support structures 186 with spherical or cylindrical shapes in the example of FIG. 29 is merely illustrative.

Figure 30:
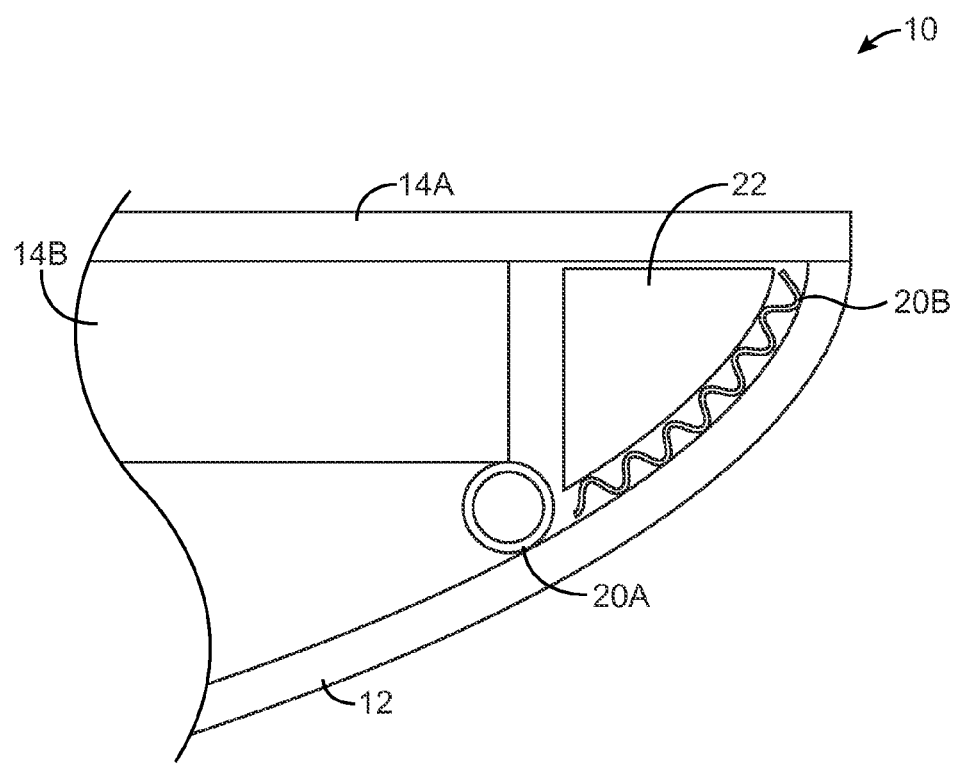
FIG. 30 is a cross-sectional view of an illustrative electronic device structure having conductive gasket structures of multiple types in accordance with an embodiment of the present invention.

An electronic device may include conductive gaskets having structures of multiple different types. FIG. 30 is a cross-sectional side view of an electronic device having conductive gaskets 20A and 20B that are formed with different types of structures. In the example of FIG. 30, Gasket 20A may be formed with a hollow tube shape (e.g., similar to gasket 20 of FIG. 4), whereas gasket 20B may be formed having a corrugated structure (e.g., similar to gasket 20 of FIG. 27).

Gasket 20A may be used to electrically connect display structures 14B to housing 12 (e.g., to help protect antenna 22 from electromagnetic interference). Gasket 20B may be used to electrically connect antenna 22 and housing 12. For example, gasket 20B may serve as an electrical grounding path from antenna 22 to housing 12.

Gasket 20B may provide sufficient electrical conductivity between antenna 22 and housing 12 while accommodating manufacturing variations that affect the placement of antenna 22 relative to housing 12. For example, due to manufacturing tolerances, the thickness of housing structure 12 and/or the dimensions of antenna 22 may vary. In this scenario, the distance between antenna 22 and housing 12 may increase (or decrease), thereby changing the amount by which gasket 20B is compressed. Gasket 20B may provide sufficient electrical conductivity even if compressed by different amounts, because the conductivity of the corrugated structure may be maintained.

Figure 31:
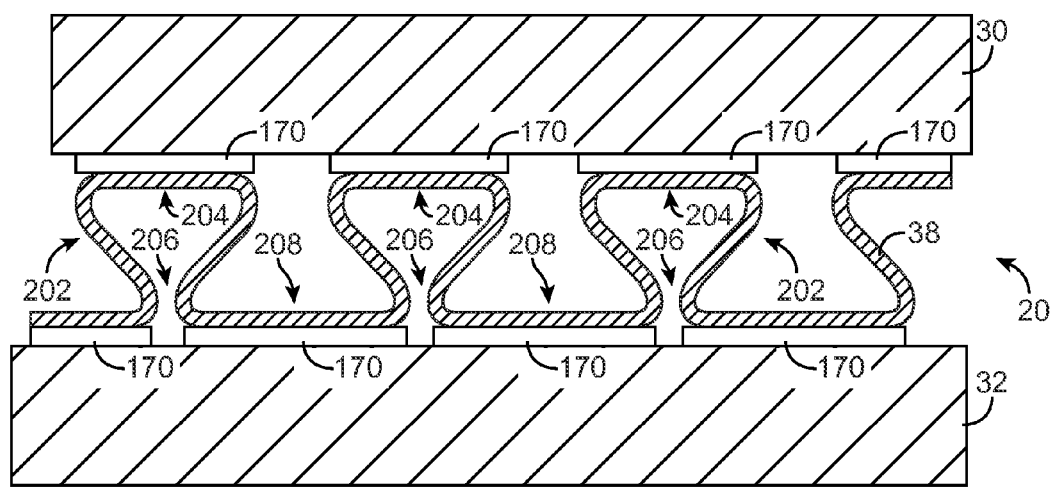
FIG. 31 is a cross-sectional view of an illustrative planar conductive gasket structure having a corrugated shape with concave ridges in accordance with an embodiment of the present invention.

Corrugated conductive gaskets such as gasket 20B may be formed with any desired wave structure. FIG. 31 is a cross-sectional diagram of an illustrative gasket 20 formed from a structure having concave ridges 202. As shown in FIG. 31, each concave ridge 202 may have a top portion 204 that is wider than a bottom gap 206. By forming ridges 202 having top portions 204 that are wider than bottom gaps 26, contact surface area between gasket 20 and opposing conductive structures 30 and 32 may be increased, thereby improving the electrical connection between gasket 20 and the opposing conductive structures.

Conductive gasket 20 may be attached to opposing conductive structures 30 and 32 via conductive adhesives 170. In the example of FIG. 31, conductive adhesives 170 may be used to couple top regions 204 to structure 30 and bottom regions 208 to structure 32. Adhesives 170 may be applied to top regions 204 and bottom regions 208 using deposition techniques such as spraying or painting. (e.g., adhesives 170 may be applied to top regions 204 and bottom regions 208 of gasket 20 without being applied to other regions of gasket 20).

Figure 32:
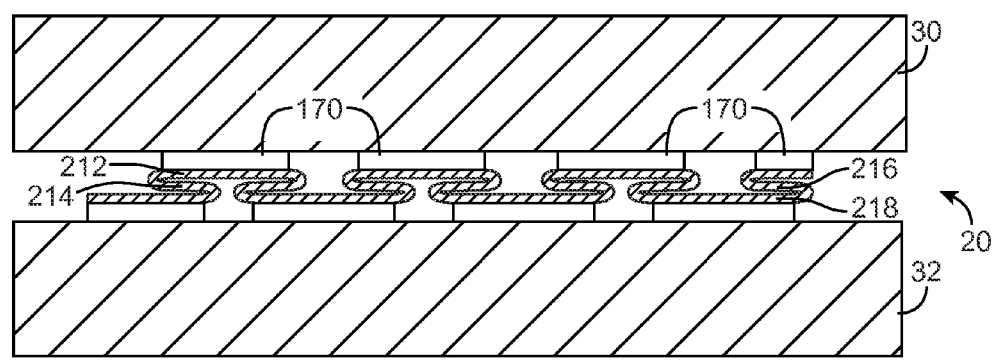
FIG. 32 is a cross-sectional view of an illustrative compressed corrugated gasket structure in accordance with an embodiment of the present invention.

Adhesive 170 may be a pressure sensitive adhesive that adheres to gasket 20 and conductive structures 30 and 32 in response to a sufficient amount of applied pressure. In this scenario, gasket 20 may be compressed between opposing conductive structures 30 and 32 to apply pressure to pressure sensitive adhesive 170. FIG. 32 is a cross-sectional side view of corrugated conductive gasket 20 when compressed using opposing conductive structures 30 and 32.

As shown in FIG. 32, portions of gasket 20 that overlap can potentially contact each other when gasket 20 is compressed. For example, portion 212 of gasket 20 may contact portion 214 and portion 216 may contact portion 218. By applying adhesives 170 only to top regions 204 and bottom regions 208 (e.g., without applying adhesive 170 to portions 212, 214, 216, or 218), gasket 20 may be able to recover its original undulating structure after compression (e.g., the structure of gasket 20 may return to the corrugated structure of FIG. 31).

Figure 33:
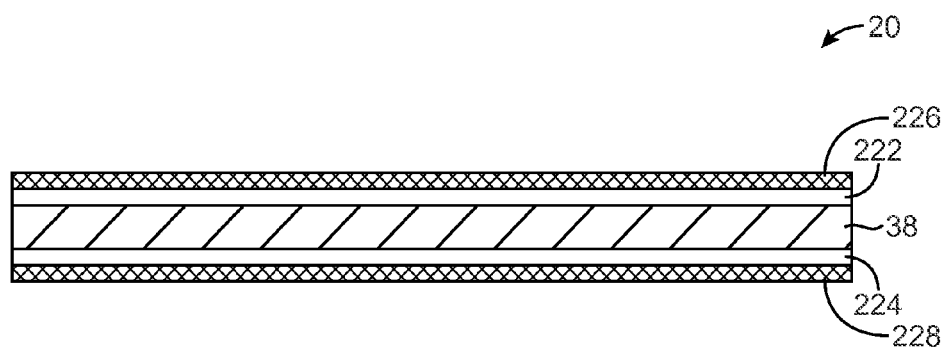
FIGS. 33-35 are cross-sectional views of illustrative steps that may be performed to form a corrugated gasket structure with adhesive layers and protective layers in accordance with an embodiment of the present invention.

If desired, a conductive gasket may have top and bottom surfaces that are covered with adhesive layers. FIG. 33 is a cross-sectional view of an illustrative conductive gasket 20 having a top surface covered by adhesive layer 222 and a bottom surface covered by an adhesive layer 224. Adhesive layers 222 and 224 may be formed from a layer of conductive adhesive material. The conductive adhesive material may be pressure-sensitive adhesive material and/or heat-sensitive adhesive material (e.g., adhesive material that adheres in response to a sufficient amount of heat). Adhesive layers 222 and 224 may be covered by protective layers 226 and 228. Layers 226 and 228 may serve to protect adhesive layers 222 and 224 from inadvertent adhesion to other surfaces. Layers 226 and 228 may be formed from materials such as plastics, paper, or other desired materials.

Gasket 20 may include a gasket structure 38 that is interposed between adhesive layers 222 and 224. Gasket structure 38 may form a gasket layer. Gasket layer 38 may be formed from a conductive material. For example, gasket layer 38 may be formed from a conductive fabric (e.g., a fabric including metal fibers or other conductive fibers). This example is merely illustrative. If desired, gasket layer 38 may be formed from any desired conductive materials or structures such as those described in connection with FIG. 4.

Figure 34:
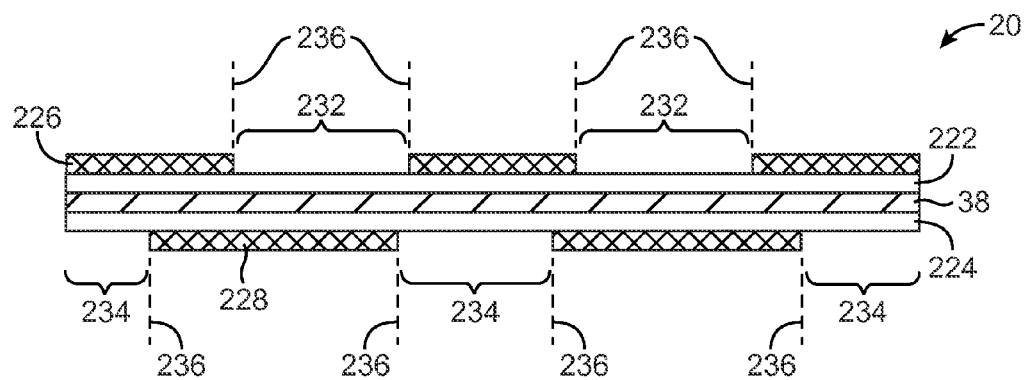

Portions of protective layers 226 and 228 may be removed to expose regions of underlying adhesive materials. FIG. 34 is a cross-sectional diagram of an illustrative gasket 22 with protective layers 226 and 228 that have been partially removed to expose regions 232 of adhesive layer 222 and regions 234 of adhesive layer 224.

Portions of protective layers 226 and 228 over regions 232 and 234 may be removed using any desired removal technique. For example, protective layers 226 and 228 may be cut along dotted lines 236 (e.g., using cutting tools such as edged cutting tools, laser cutting tools, etc.). In this scenario, portions of protective layers 226 and 228 over regions 232 and 234 may be subsequently peeled away and removed from adhesive layers 222 and 224. If desired, other removal techniques such as etching or grinding may be used to remove portions of protective layers 226 and 228 to expose regions 232 and 234 of adhesive material.

Figure 35:
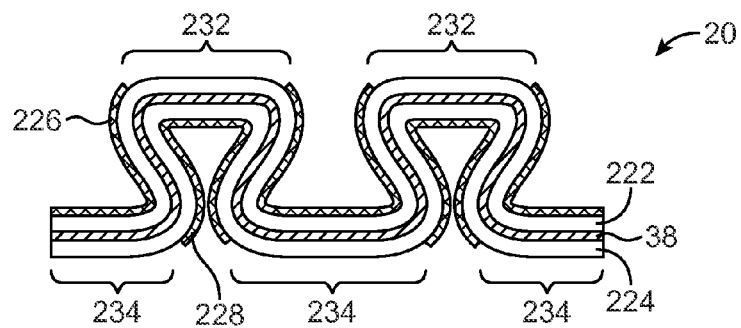

In a subsequent step, gasket 20 may be folded to form a corrugated structure as shown in FIG. 35. Exposed portions 232 of adhesive layer 222 may be used to form top regions (e.g., top regions 204 of FIG. 31) that can be attached to a first conductive structure (e.g., conductive structure 30). Exposed portions 234 of adhesive layer 224 may be used to form bottom regions (e.g., bottom regions 208) that can be attached to a second conductive structure such as conductive structure 32).

Remaining portions of protective layers 226 and 228 may serve to help prevent deformation of gasket 20 when attached to conductive structures. For example, pressure may be applied to compress gasket 20 so that regions 232 and 234 of adhesive material are attached to the conductive structures. In this scenario, the remaining portions of protective layers 226 and 228 may cover regions of adhesive layers 222 and 224 that are not attached to the conductive structures, thereby helping to prevent undesired adhesion to surfaces other than the conductive structures (e.g., protective layers 226 and 228 may help prevent adhesion between overlapping portions of gasket layer 38).

Figure 36:
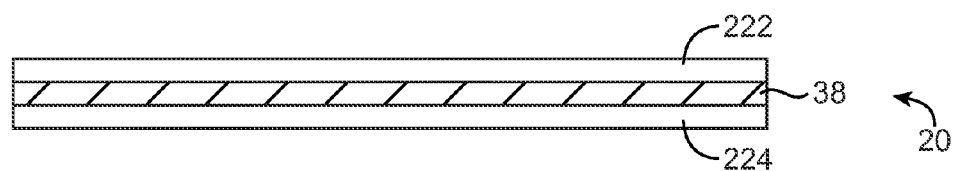
FIG. 36 is a cross-sectional view of an illustrative gasket structure that may be used to form a corrugated gasket structure in accordance with an embodiment of the present invention.

If desired, a conductive gasket may have top and bottom surfaces that are covered with adhesive layers that are not protected by additional layers. FIG. 36 is a cross-sectional diagram of an illustrative gasket 20 with adhesive layers 222 and 224 that cover respective top and bottom surfaces of gasket 20. Gasket 20 may include a gasket layer 38 interposed between adhesive layers 222 and 224.

Figure 37:
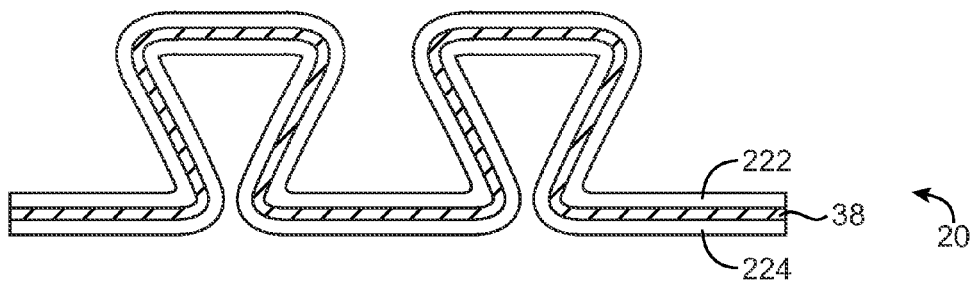
FIG. 37 is a cross-sectional view of an illustrative corrugated gasket structure having adhesive layers in accordance with an embodiment of the present invention.

Gasket 20 that is covered with conductive adhesive layers 222 and 224 may be folded to form a corrugated gasket structure as shown in FIG. 37. In scenarios in which gasket structure 38 is covered by adhesive layers 222 and 224 that are exposed (e.g., as shown in FIG. 37), the adhesive layers may adhere to undesired surfaces when compressed (e.g., overlapping regions of gasket layer 38 may adhere when compressed together). Gasket structure 38 may be deformed and unable to return to its original corrugated shape when overlapping regions of gasket layer 38 have been attached via adhesive layers 222 and 224.

Figure 38:
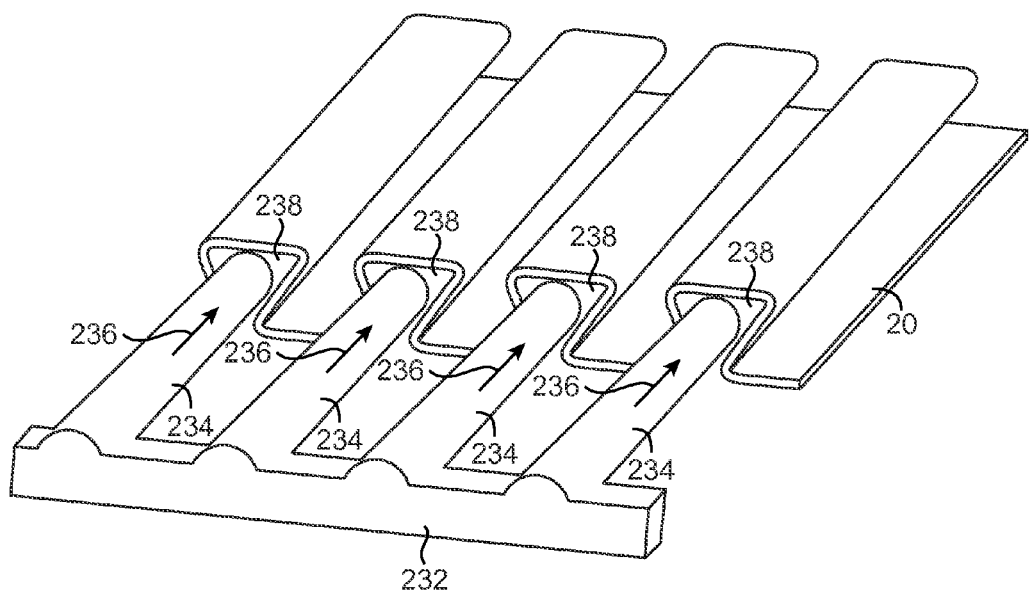
FIG. 38 is a perspective view of an illustrative support structure that may be inserted into cavities of a corrugated gasket structure in accordance with an embodiment of the present invention.

Support structures may be used to help prevent deformation of gasket structure 38. FIG. 38 is a perspective view of an illustrative support structure 232 that may be used to help prevent structural deformation of gasket 20 during manufacturing processes such as when gasket 20 is compressed. As shown in FIG. 38, support structure 232 may include protruding members 234. Protruding members 234 may be substantially cylindrical (e.g., rod-shaped) and may extend in parallel along a plane corresponding to a planar corrugated gasket 20. Protruding members 234 may be inserted as shown by arrows 236 into cavities 238 of corrugated gasket 20.

The example of FIG. 38 in which protruding members 234 of support structure 232 are substantially cylindrical is merely illustrative. Protruding members 234 may have any desired shape for helping to prevent deformation of gasket 20 during manufacturing processes. For example, protruding members 234 may have cross-sectional shapes that correspond to the cross-sectional shapes of cavities in gasket 20 that may be compressed during manufacturing processes.

Protruding members 234 may be formed from materials that are resistant to adhesion (sometimes referred to herein as non-stick materials). For example, protruding members 234 may be formed from silicone, fluorocarbons such as polytetrafluoroethylene, or any other materials that are resistant to adhesion. If desired, protruding members 234 may be formed having interior cores that are coated with a non-stick material. The interior cores may be formed from any desired material (e.g., metals, plastics, etc.).

Figure 39:
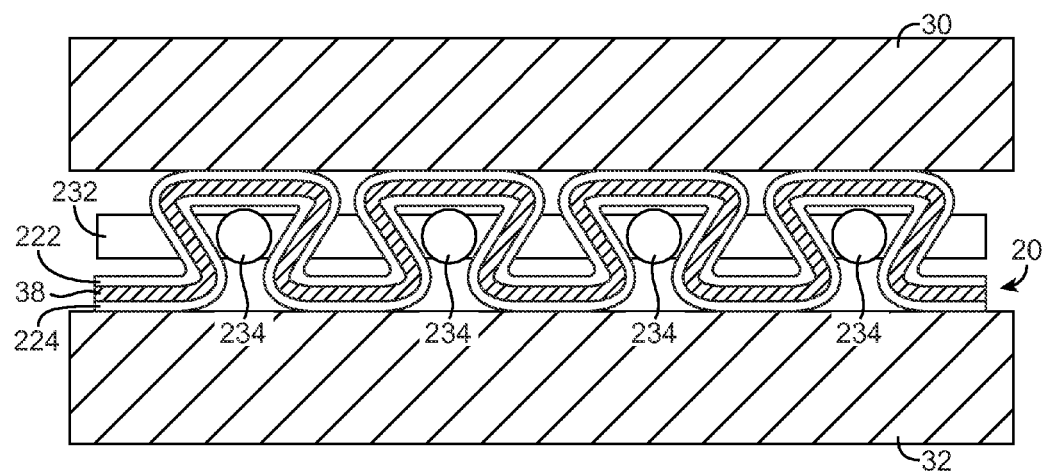
FIG. 39 is a cross-sectional view of an illustrative corrugated gasket structure having cavities in which a support structure has been inserted in accordance with an embodiment of the present invention.

FIG. 39 is an illustrative cross-sectional diagram of gasket 20 with protruding members 234 of support structure 232 inserted into cavities of gasket 20 (e.g., cavities 238 of FIG. 38). During manufacturing, gasket 20 may be compressed by opposing conductive structures 30 and 32 so that adhesive layers 222 and 224 adhere to structures 30 and 32. Protruding members 234 may tend to resist compression and may help prevent deformation of gasket 20 (e.g., because overlapping regions of gasket 20 may not contact each other).

Figure 40:
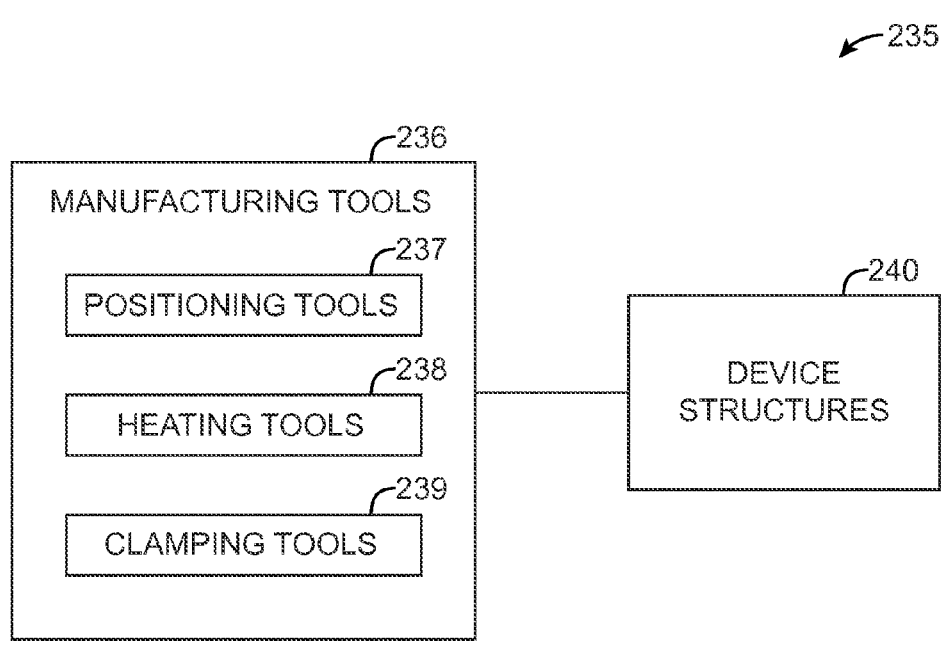
FIG. 40 is an illustrative diagram of a manufacturing system that may be used to form conductive gasket structures in accordance with an embodiment of the present invention.

Manufacturing tools may be used to attach conductive gaskets to conductive structures. FIG. 40 is an illustrative diagram of a manufacturing system 235 that may be used to attach conductive gaskets to conductive structures. As shown in FIG. 40, system 235 may include manufacturing tools 236 and device structures 240. Devices structures 240 may include structures used in an electronic device such as device 10. For example, structures 240 may include conductive structures such as antenna 22, device housing 12, display structures 14B, conductive gaskets, etc.

Manufacturing tools 236 may include positioning tools 237, heating tools 238, and clamping tools 239. Positioning tools 237 may be used to adjust the position of device structures 240 or portions of device structures 240. For example, positioning tools 237 may include motors and actuators that can be used to adjust the position of antenna 22, device housing 12, conductive gaskets, or other portions of device structures 240. Positioning tools 237 may include computer-controlled positioning tools or manual positioning tools.

Heating tools 238 may include oil-based heating tools, gas-based heating tools, electrical-based heating tools, or any other heating tools suitable for heating materials such as adhesive materials (e.g., adhesive materials used to form adhesive layers that cover conductive gaskets).

Clamping tools 239 may include clamps such as mechanical-based or hydraulic-based clamps. Clamping tools 239 may be used to hold device structures 240 in a fixed position during manufacturing (e.g., during assembly). Clamping tools 239 may also be used to apply pressure to portions of device structures 240. For example, clamping tools 239 may be used to compress opposing conductive structures 30 of FIG. 39 so that pressure is applied to adhesive layers 222 and 224.

Figure 41:
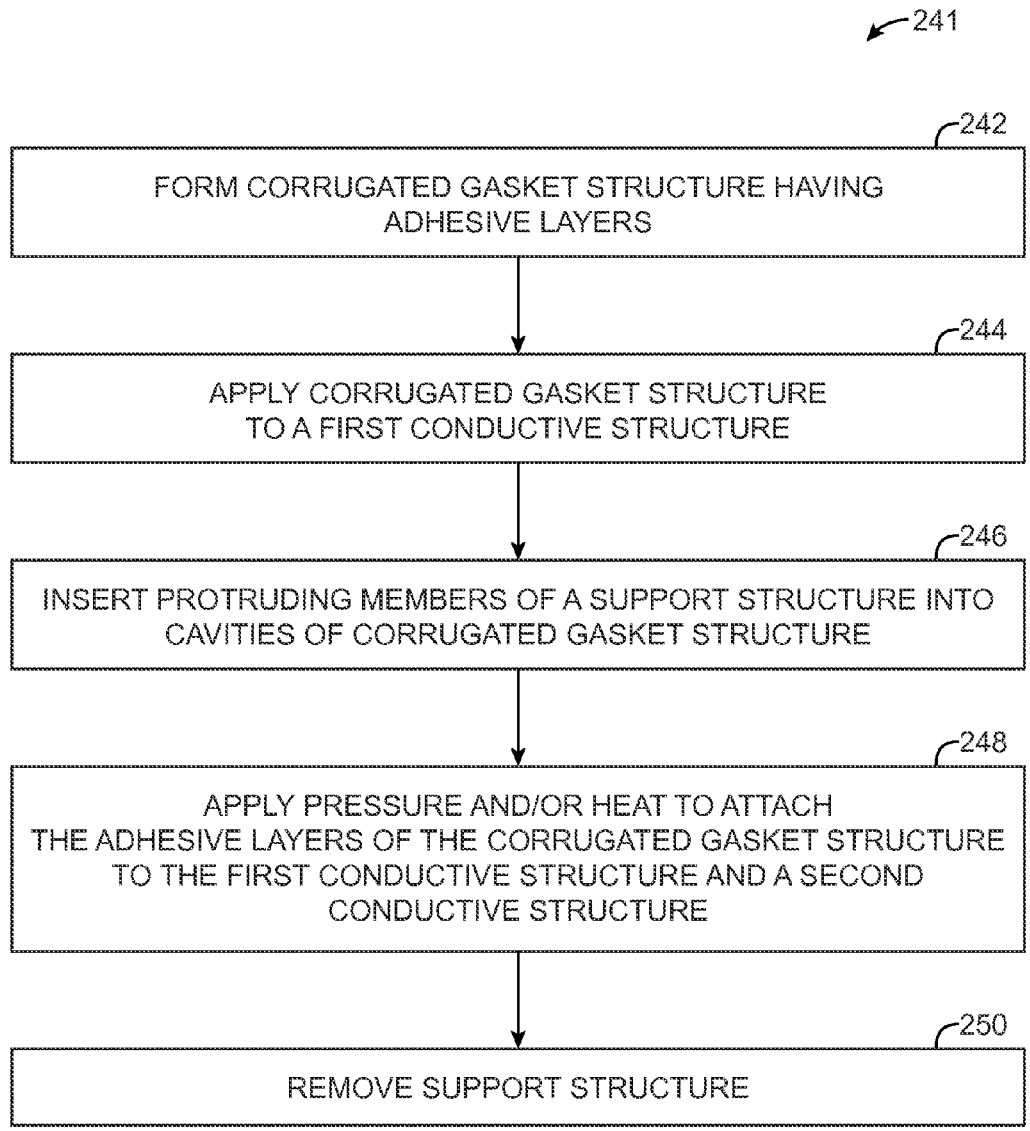
FIG. 41 is a flow chart of illustrative steps that may be performed to attach a corrugated gasket structure to opposing conductive structures in accordance with an embodiment of the present invention.

Manufacturing tools 236 may be used to attach a conductive gasket between first and second conductive structures. FIG. 41 is a flow chart 241 of illustrative steps that may be to attach a corrugated gasket to first and second conductive structures.

In step 242, a corrugated gasket may be formed having adhesive layers that cover the corrugated gasket. For example, corrugated gasket 20 of FIG. 37 may be formed having adhesive layer 222 that covers a top surface of gasket 20 and adhesive layer 224 that covers a bottom surface of gasket 20.

In step 244, the corrugated gasket may be applied to a first conductive structure. For example, a top surface of the corrugated gasket that is covered by an adhesive layer may be applied to antenna 22 of FIG. 2. The corrugated gasket may be applied to the first conductive structure using positioning tools 237 (e.g., by positioning the corrugated gasket to contact the first conductive structure).

In step 246, protruding members of a support structure may be inserted into cavities in the corrugated gasket. For example, protruding members 234 of support structure 232 may be inserted using positioning tools 237 into cavities 238 of gasket 20 as shown in FIG. 38. The protruding members may be formed from or covered by a non-stick material that is resistant to adhesion with the adhesive layers of the corrugated gasket.

In step 248, pressure and/or heat may be applied to the adhesive layers of the corrugated gasket so that the corrugated gasket is attached to the first conductive structure and a second conductive structure. For example, positioning tools 237 may be used to position the corrugated gasket between antenna 22 and device housing 12 of FIG. 2. In this scenario, clamping tools 239 may be subsequently used to compress the corrugated gasket between antenna 22 and device housing 12 so that the adhesive layers (e.g., adhesive layers 222 and 224) covering the corrugated gasket attach to antenna 22 and device housing 12. If desired, heating tools 238 may be used to apply heat in addition to or in place of pressure (e.g., when adhesive layers 222 and 224 are formed from a heat-sensitive adhesive material).

In step 250, the support structure may be removed from the corrugated gasket. For example, positioning tools 237 may be used to remove the protruding members from cavities in the corrugated gasket.

The example of FIG. 41 in which protruding members of a support structure are used to help prevent deformation of a corrugated gasket is merely illustrative. If desired, a corrugated gasket may be attached to first and second conductive structures without using the support structure. For example, steps 246 and 250 may be omitted when performing the operations of flow chart 241.

The foregoing is merely illustrative of the principles of this invention and various modifications can be made by those skilled in the art without departing from the scope and spirit of the invention.

What is claimed is:

1. A conductive gasket configured to form an electrical path when compressed between opposing conductive structures in an electronic device, comprising:
   a conductive gasket wall surrounding at least one air-filled cavity; and
   a compressible interior structure that is surrounded by the conductive gasket wall, wherein the compressible interior structure comprises a structure with protrusions, and wherein the at least one cavity is interposed between at least some of the protrusions.

2. The conductive gasket defined in claim 1 wherein the conductive gasket has an elongated tubular shape extending along a longitudinal axis and wherein the conductive gasket wall extends around the longitudinal axis.

3. The conductive gasket defined in claim 1 wherein the compressible interior structure comprises a fiber-based structure containing fibers.

4. The conductive gasket defined in claim 1 wherein the structure has an undulating surface.

5. A conductive gasket configured to form an electrical path when compressed between opposing conductive structures in an electronic device, comprising:
   a conductive gasket wall surrounding at least one air-filled cavity, wherein the conductive gasket is a hollow gasket having a hollow air-filled interior, wherein the conductive gasket has an elongated tubular shape extending along a longitudinal axis, wherein the conductive gasket wall extends around the longitudinal axis, wherein the conductive gasket wall has an inner surface and an outer surface and wherein an edge portion of the inner surface is attached to an edge portion of the outer surface with adhesive.

6. A conductive gasket configured to form an electrical path when compressed between opposing conductive structures in an electronic device, comprising:
   a conductive gasket wall surrounding at least one air-filled cavity, wherein the conductive gasket is a hollow gasket having a hollow air-filled interior, wherein the conductive gasket has an elongated tubular shape extending along a longitudinal axis, wherein the conductive gasket wall extends around the longitudinal axis, and wherein the conductive gasket wall comprises conductive fiber.

7. The conductive gasket defined in claim 6 wherein the conductive fiber comprises metal coated dielectric fibers.

8. A conductive gasket configured to form an electrical path when compressed between opposing conductive structures in an electronic device, comprising:
   a conductive gasket wall surrounding at least one air-filled cavity; and
   a compressible interior structure that is surrounded by the conductive gasket wall, wherein the compressible interior structure comprises a sheet of material that lines the conductive gasket wall.

9. The conductive gasket defined in claim 8 wherein the sheet of material comprises a sheet of foam that is attached to the conductive gasket wall with adhesive.

10. An elongated tubular gasket configured to form an electrical path when compressed between opposing conductive structures, wherein the elongated tubular gasket has a longitudinal axis, the elongated tubular gasket comprising:
    a conductive gasket wall that extends around the longitudinal axis and around at least one elongated cavity region to form the elongated tubular gasket that contains at least one air-filled cavity; and
    a compressible interior structure that is surrounded by the conductive gasket wall, wherein the compressible interior structure is a fiber-based structure formed entirely from plastic fibers.

11. The elongated tubular gasket defined in claim 10 wherein the conductive gasket wall comprises a layer of conductive fabric having conductive fibers.

12. The elongated tubular gasket defined in claim 10 wherein the conductive gasket wall comprises a layer of dielectric coated with metal.

13. The elongated tubular gasket defined in claim 10 wherein the conductive gasket wall comprises a conductive layer attached to a dielectric support layer with adhesive.

14. The elongated tubular gasket defined in claim 10, wherein elongated tubular gasket has an interior volume, and wherein the fiber-based structure takes up between 5% and 50% of the interior volume of the elongated tubular gasket.

15. An elongated tubular gasket configured to form an electrical path when compressed between opposing conductive structures, wherein the elongated tubular gasket has a longitudinal axis, the elongated tubular gasket comprising:
    a conductive fabric layer that extends at least partly around the longitudinal axis and around at least one elongated cavity region to form the elongated tubular gasket; and
    a support structure formed in the elongated cavity region that is surrounded by the conductive fabric layer, wherein the support structure has a non-planar surface that forms a plurality of air-filled cavities in the elongated cavity region.

16. The elongated tubular gasket defined in claim 15 wherein the conductive fabric layer has edges that are attached to each other to form an O-shaped cross section for the elongated tubular gasket.

17. The elongated tubular gasket defined in claim 15 wherein the conductive fabric layer has edges that are attached to each other to form a P-shaped cross-section for the elongated tubular gasket.

18. The elongated tubular gasket defined in claim 15 further comprising a planar conductive layer, wherein the conductive fabric layer has edges that are attached to the planar conductive with conductive adhesive.

19. The elongated tubular gasket defined in claim 15 wherein the conductive fabric layer has a portion that is configured to form a C-shaped cross section for the elongated tubular gasket.

\* \* \* \* \*